US008753724B2

(12) United States Patent
Nieh et al.

(10) Patent No.: US 8,753,724 B2
(45) Date of Patent: Jun. 17, 2014

(54) PLASMA DEPOSITION ON A PARTIALLY FORMED BATTERY THROUGH A MESH SCREEN

(71) Applicants: Kai Wei Nieh, Monrovia, CA (US); Jiuh-Ming Liang, Hacienda Heights, CA (US); Victor Krasnov, Tarzana, CA (US)

(72) Inventors: Kai Wei Nieh, Monrovia, CA (US); Jiuh-Ming Liang, Hacienda Heights, CA (US); Victor Krasnov, Tarzana, CA (US)

(73) Assignee: Front Edge Technology Inc., Baldwin Park, CA (US)

( * ) Notice: Subject to any disclaimer, the term of this patent is extended or adjusted under 35 U.S.C. 154(b) by 0 days.

(21) Appl. No.: 13/627,977

(22) Filed: Sep. 26, 2012

(65) Prior Publication Data

US 2014/0087092 A1    Mar. 27, 2014

(51) Int. Cl.
*H05H 1/24* (2006.01)
*B05D 5/12* (2006.01)

(52) U.S. Cl.
USPC .......................... 427/569; 427/115; 427/282

(58) Field of Classification Search
USPC .......................................... 427/569, 115, 282
See application file for complete search history.

(56) References Cited

U.S. PATENT DOCUMENTS

| | | |
|---|---|---|
| 3,375,135 A | 3/1968 | Moulton et al. |
| 3,414,685 A | 12/1968 | Geib et al. |
| 3,530,007 A | 9/1970 | Golubovic |
| 3,844,841 A | 10/1974 | Baker |
| 3,969,142 A | 7/1976 | Greatbatch et al. |
| 3,993,508 A | 11/1976 | Erlichman |
| 4,031,449 A | 6/1977 | Trombly |
| 4,119,769 A | 10/1978 | Schneider et al. |
| 4,233,371 A | 11/1980 | Dorrestijn |
| 4,279,726 A | 7/1981 | Baird et al. |
| 4,309,494 A | 1/1982 | Stockel |
| 4,421,835 A | 12/1983 | Manassen et al. |
| 4,459,328 A | 7/1984 | Mizuhara |
| 4,543,441 A | 9/1985 | Kumada et al. |
| 4,565,753 A | 1/1986 | Goebel et al. |
| 4,597,844 A | 7/1986 | Hiraki et al. |
| 4,619,865 A | 10/1986 | Keem et al. |
| 4,663,183 A | 5/1987 | Ovshinsky et al. |
| 4,698,256 A | 10/1987 | Giglia et al. |
| 4,714,660 A | 12/1987 | Gates, Jr. |
| 4,725,345 A | 2/1988 | Sakamoto et al. |
| 4,777,090 A | 10/1988 | Ovshinsky et al. |
| 4,871,433 A | 10/1989 | Wagner et al. |
| 4,873,115 A | 10/1989 | Matsumura et al. |
| 4,877,677 A | 10/1989 | Hirochi et al. |
| 4,882,212 A | 11/1989 | SingDeo et al. |
| 4,904,542 A | 2/1990 | Mroczkowski |
| 4,996,079 A | 2/1991 | Itoh |
| 5,019,467 A | 5/1991 | Fujiwara |
| 5,171,413 A | 12/1992 | Arntz et al. |
| 5,197,889 A | 3/1993 | Rizzo et al. |
| 5,240,794 A | 8/1993 | Thackeray et al. |
| 5,249,554 A | 10/1993 | Tamor et al. |
| 5,250,891 A | 10/1993 | Glasgow |
| 5,253,300 A | 10/1993 | Knapp |
| 5,254,415 A | 10/1993 | Williams et al. |
| 5,262,028 A | 11/1993 | Manley |
| 5,330,853 A | 7/1994 | Hofmann et al. |
| 5,338,625 A | 8/1994 | Bates et al. |
| 5,368,939 A | 11/1994 | Kawamura et al. |
| 5,445,906 A | 8/1995 | Hobson et al. |
| 5,478,456 A | 12/1995 | Humpal et al. |
| 5,490,911 A | 2/1996 | Makowiecki et al. |
| 5,498,490 A | 3/1996 | Brodd |
| 5,503,912 A | 4/1996 | Setoyama et al. |
| 5,506,858 A | 4/1996 | Takenaka et al. |
| 5,511,587 A | 4/1996 | Miya et al. |
| 5,512,147 A | 4/1996 | Bates et al. |
| 5,512,387 A | 4/1996 | Ovshinsky |
| 5,516,340 A | 5/1996 | Takeuchi et al. |
| 5,547,767 A | 8/1996 | Paidassi et al. |
| 5,552,242 A | 9/1996 | Ovshinsky et al. |
| 5,554,456 A | 9/1996 | Ovshinsky et al. |
| 5,561,004 A | 10/1996 | Bates et al. |
| 5,597,660 A | 1/1997 | Bates et al. |

(Continued)

FOREIGN PATENT DOCUMENTS

| | | |
|---|---|---|
| CN | 1661354 A | 8/2005 |
| EP | 0 829 913 A | 3/1998 |

(Continued)

OTHER PUBLICATIONS

Marcinek, Marek L., "Microwave Plasma Chemical Vapor Deposition of Carbon Coatings on LiNi1/3Co1/3Mn1/3O2 for Li-Ion Battery Composite Cathodes". Journal of The Electrochemical Society, 156 (1) A48-A51 (2009).*
Dudney, Nancy J., et al., "Thin Film Micro-Batteries". The Electrochemical Society Interface, Fall 2008, p. 44-48.*
Antaya et al. "Preparation and Characterization of LiCoO2 Thin Films by Laser Ablation Deposition", J. Electrochem. Soc., vol. 140, No. 3, Mar. 1993, pp. 575-578.
Fragnaud et al. "Characterization of sprayed and sputter deposited LiCoO2 thin films for rechargeable microbatteries", J. Power Sources, 63 (1996), pp. 187-191.
Birke et al. "Materials for lithium thin-film batteries for application in silicon technology", Solid State Ionics, 93 (1997), pp. 1-15.
Benqlilou-Moudden et al. "Amorphous Lithium Cobalt and Nickel Oxides Thin Films Preparation and Characterization by RBS and PIGE", Thin Solid Films 333 (1998), pp. 16-19.
Yang et al., "Effect of annealing temperature on structure and electrochemical properties of LiCoO2 cathode thin films", Rare Metals, vol. 25, Dec. 2006, pp. 189-192.

(Continued)

*Primary Examiner* — Bret Chen
(74) *Attorney, Agent, or Firm* — Ashok K. Janah; Janah & Associates, PC

(57) ABSTRACT

A plasma deposition method deposits a battery component material on a partially fabricated battery cell comprising a battery component layer containing charge-carrying metal species and having an exposed surface. A mesh screen is maintained at a preset distance from the exposed surface, the mesh screen having a plurality of mesh openings. A process gas is energized to form a plasma by applying an electrical power to deposit the battery component material onto the exposed surface of the battery component layer. The mesh screen reduces migration of the charge-carrying metal species in the battery component layer to the exposed surface of the partially fabricated battery cell.

17 Claims, 10 Drawing Sheets

(56) References Cited

U.S. PATENT DOCUMENTS

| | | | |
|---|---|---|---|
| 5,607,789 A | 3/1997 | Treger et al. | |
| 5,612,152 A | 3/1997 | Bates et al. | |
| 5,629,560 A | 5/1997 | Katsui et al. | |
| 5,650,243 A | 7/1997 | Ferment et al. | |
| 5,656,364 A | 8/1997 | Rickerby et al. | |
| 5,663,183 A | 9/1997 | Frost et al. | |
| 5,670,252 A | 9/1997 | Makowiecki et al. | |
| 5,670,272 A | 9/1997 | Cheu et al. | |
| 5,681,666 A | 10/1997 | Treger et al. | |
| 5,700,551 A | 12/1997 | Kukino et al. | |
| 5,705,293 A | 1/1998 | Hobson | |
| 5,705,297 A | 1/1998 | Warren | |
| 5,708,297 A | 1/1998 | Clayton | |
| 5,725,909 A | 3/1998 | Shaw et al. | |
| 5,786,582 A | 7/1998 | Roustaei et al. | |
| 5,814,195 A | 9/1998 | Lehan et al. | |
| 5,818,199 A | 10/1998 | Beard | |
| 5,824,374 A | 10/1998 | Bradley, Jr. et al. | |
| 5,871,865 A | 2/1999 | Barker et al. | |
| 5,894,656 A | 4/1999 | Menon et al. | |
| 5,932,368 A | 8/1999 | Batawi et al. | |
| 5,961,672 A | 10/1999 | Skotheim et al. | |
| 5,981,102 A | 11/1999 | Grigg et al. | |
| 5,985,485 A | 11/1999 | Ovshinsky et al. | |
| 6,017,654 A | 1/2000 | Kumta et al. | |
| 6,022,640 A | 2/2000 | Takada et al. | |
| 6,039,850 A | 3/2000 | Schulz | |
| 6,040,680 A | 3/2000 | Toya et al. | |
| 6,046,575 A | 4/2000 | Demuro | |
| 6,051,114 A | 4/2000 | Yao et al. | |
| 6,118,248 A | 9/2000 | Gartstein et al. | |
| 6,146,715 A | 11/2000 | Kim et al. | |
| 6,148,503 A | 11/2000 | Delnick et al. | |
| 6,168,884 B1 | 1/2001 | Neudecker et al. | |
| 6,197,450 B1 | 3/2001 | Nathan et al. | |
| 6,217,623 B1 | 4/2001 | Reichert et al. | |
| 6,218,049 B1 | 4/2001 | Bates et al. | |
| 6,220,765 B1 | 4/2001 | Tatoh | |
| 6,227,204 B1 | 5/2001 | Baumann et al. | |
| 6,238,847 B1 | 5/2001 | Axtell, III et al. | |
| 6,242,129 B1 | 6/2001 | Johnson | |
| 6,264,709 B1 | 7/2001 | Yoon et al. | |
| 6,280,875 B1 | 8/2001 | Kwak et al. | |
| 6,287,711 B1 | 9/2001 | Nieh et al. | |
| 6,340,880 B1 | 1/2002 | Higashijima et al. | |
| 6,365,010 B1 | 4/2002 | Hollars | |
| 6,379,835 B1 | 4/2002 | Kucherovsky et al. | |
| 6,387,039 B1 | 5/2002 | Moses | |
| 6,387,563 B1 | 5/2002 | Bates | |
| 6,398,824 B1 | 6/2002 | Johnson | |
| 6,402,796 B1 | 6/2002 | Johnson | |
| 6,411,780 B1 | 6/2002 | Maruyama | |
| 6,413,645 B1 | 7/2002 | Graff et al. | |
| 6,461,757 B1 | 10/2002 | Sasayama et al. | |
| 6,472,295 B1 | 10/2002 | Morris et al. | |
| 6,501,014 B1 * | 12/2002 | Kubota et al. | 136/256 |
| 6,517,968 B2 | 2/2003 | Johnson | |
| 6,558,836 B1 | 5/2003 | Whitacre et al. | |
| 6,632,563 B1 | 10/2003 | Krasnov et al. | |
| 6,636,017 B2 | 10/2003 | Zink et al. | |
| 6,645,658 B2 | 11/2003 | Morozumi | |
| 6,658,124 B1 | 12/2003 | Meadows | |
| 6,661,197 B2 | 12/2003 | Zink et al. | |
| 6,696,199 B2 | 2/2004 | Yoshida et al. | |
| 6,700,766 B2 | 3/2004 | Sato | |
| 6,713,987 B2 | 3/2004 | Krasnov et al. | |
| 6,780,544 B2 | 8/2004 | Noh | |
| 6,805,998 B2 | 10/2004 | Jenson et al. | |
| 6,863,699 B1 | 3/2005 | Krasnov et al. | |
| 6,866,901 B2 | 3/2005 | Burrows et al. | |
| 6,916,679 B2 | 7/2005 | Snyder et al. | |
| 6,921,464 B2 | 7/2005 | Krasnov et al. | |
| 6,940,988 B1 | 9/2005 | Shennib et al. | |
| 6,982,132 B1 | 1/2006 | Goldner et al. | |
| 7,037,621 B2 | 5/2006 | Kikuchi et al. | |
| 7,056,620 B2 | 6/2006 | Krasnov et al. | |
| 7,122,908 B2 | 10/2006 | Jiang et al. | |
| 7,131,189 B2 | 11/2006 | Jenson | |
| 7,157,187 B2 | 1/2007 | Jenson | |
| 7,186,479 B2 | 3/2007 | Krasnov et al. | |
| 7,194,801 B2 | 3/2007 | Jenson et al. | |
| 7,194,901 B2 | 3/2007 | Silverbrook et al. | |
| 7,276,878 B2 | 10/2007 | Phillips et al. | |
| 7,286,479 B2 | 10/2007 | Bragg | |
| 7,308,316 B2 | 12/2007 | Schommer | |
| 7,359,590 B2 | 4/2008 | Hsu | |
| 7,397,118 B2 | 7/2008 | Tominaga | |
| 7,501,202 B2 | 3/2009 | Enomoto et al. | |
| 7,510,582 B2 | 3/2009 | Krasnov et al. | |
| 7,524,577 B2 | 4/2009 | Bates | |
| 7,701,176 B2 | 4/2010 | Chen | |
| 7,846,579 B2 | 12/2010 | Krasnov et al. | |
| 7,862,627 B2 | 1/2011 | Li et al. | |
| 7,862,927 B2 | 1/2011 | Krasnov et al. | |
| 7,959,769 B2 | 6/2011 | Zhang et al. | |
| 8,030,898 B2 | 10/2011 | Okuto | |
| 8,168,322 B2 | 5/2012 | Krasnov et al. | |
| 2001/0007335 A1 | 7/2001 | Tuttle et al. | |
| 2001/0041294 A1 | 11/2001 | Chu et al. | |
| 2001/0049050 A1 * | 12/2001 | Aragane et al. | 429/62 |
| 2001/0052645 A1 | 12/2001 | Op'T Eynde et al. | |
| 2002/0004167 A1 | 1/2002 | Jenson et al. | |
| 2002/0028384 A1 | 3/2002 | Krasnov et al. | |
| 2002/0041930 A1 | 4/2002 | Erdemir et al. | |
| 2002/0071989 A1 * | 6/2002 | Verma et al. | 429/176 |
| 2002/0100989 A1 | 8/2002 | Jiang et al. | |
| 2002/0102400 A1 | 8/2002 | Gorokhovsky et al. | |
| 2002/0110733 A1 | 8/2002 | Johnson | |
| 2002/0150823 A1 | 10/2002 | Breitkopf et al. | |
| 2003/0118897 A1 * | 6/2003 | Mino et al. | 429/149 |
| 2003/0121142 A1 | 7/2003 | Kikuchi et al. | |
| 2003/0143460 A1 | 7/2003 | Yoshida et al. | |
| 2003/0152829 A1 | 8/2003 | Zhang et al. | |
| 2003/0160589 A1 | 8/2003 | Krasnov et al. | |
| 2004/0018424 A1 | 1/2004 | Zhang et al. | |
| 2004/0064937 A1 | 4/2004 | Krasnov et al. | |
| 2004/0086762 A1 | 5/2004 | Maeda et al. | |
| 2004/0175609 A1 | 9/2004 | Yageta et al. | |
| 2005/0079418 A1 | 4/2005 | Kelley et al. | |
| 2005/0112461 A1 | 5/2005 | Amine et al. | |
| 2005/0130032 A1 | 6/2005 | Krasnov et al. | |
| 2005/0147877 A1 | 7/2005 | Tarnowski et al. | |
| 2005/0156573 A1 | 7/2005 | Lin | |
| 2005/0275370 A1 | 12/2005 | Kim | |
| 2006/0027937 A1 | 2/2006 | Benson et al. | |
| 2006/0040169 A1 | 2/2006 | Liu et al. | |
| 2006/0040170 A1 | 2/2006 | Liu et al. | |
| 2006/0060956 A1 | 3/2006 | Tanikella | |
| 2006/0068258 A1 | 3/2006 | Kinoshita | |
| 2006/0115706 A1 | 6/2006 | Maeda et al. | |
| 2006/0134522 A1 | 6/2006 | Zhang et al. | |
| 2006/0152196 A1 | 7/2006 | Matsumoto et al. | |
| 2006/0216589 A1 | 9/2006 | Krasnov et al. | |
| 2006/0226812 A1 | 10/2006 | Patino et al. | |
| 2006/0267546 A1 | 11/2006 | Shen et al. | |
| 2007/0000688 A1 | 1/2007 | Mobley | |
| 2007/0037054 A1 | 2/2007 | Kikuchi et al. | |
| 2007/0047750 A1 | 3/2007 | Sauer et al. | |
| 2007/0047796 A1 | 3/2007 | Anantharaman | |
| 2007/0104343 A1 | 5/2007 | Bengtsson et al. | |
| 2007/0104344 A1 | 5/2007 | Goldberg | |
| 2007/0125638 A1 | 6/2007 | Zhang et al. | |
| 2007/0141460 A1 | 6/2007 | You et al. | |
| 2007/0166612 A1 | 7/2007 | Krasnov et al. | |
| 2007/0172739 A1 | 7/2007 | Visco et al. | |
| 2007/0200258 A1 | 8/2007 | Mahler et al. | |
| 2007/0297108 A1 | 12/2007 | Collins et al. | |
| 2008/0003492 A1 | 1/2008 | Bates | |
| 2008/0087986 A1 | 4/2008 | Tanikella | |
| 2008/0191342 A1 | 8/2008 | Otremba | |
| 2008/0213664 A1 | 9/2008 | Krasnov et al. | |
| 2008/0217162 A1 | 9/2008 | Delrue et al. | |
| 2008/0253098 A1 | 10/2008 | Liu | |
| 2008/0263855 A1 | 10/2008 | Li et al. | |

(56) References Cited

U.S. PATENT DOCUMENTS

| | | |
|---|---|---|
| 2008/0290363 A1 | 11/2008 | Lin et al. |
| 2008/0303056 A1 | 12/2008 | Ward et al. |
| 2008/0308935 A1 | 12/2008 | Kim et al. |
| 2009/0010462 A1 | 1/2009 | Ekchian et al. |
| 2009/0029500 A1 | 1/2009 | Wan |
| 2009/0039498 A1 | 2/2009 | Bayerer |
| 2009/0057136 A1 | 3/2009 | Wang et al. |
| 2009/0114429 A1 | 5/2009 | Sri-Jayantha et al. |
| 2009/0115051 A1 | 5/2009 | Leung et al. |
| 2009/0136839 A1 | 5/2009 | Kraznov et al. |
| 2009/0159433 A1 | 6/2009 | Neudecker et al. |
| 2009/0208671 A1 | 8/2009 | Nieh et al. |
| 2010/0028767 A1 | 2/2010 | Inose et al. |
| 2010/0028775 A1* | 2/2010 | Emura et al. ............... 429/209 |
| 2010/0247987 A1 | 9/2010 | Holung et al. |
| 2010/0264017 A1 | 10/2010 | Nam et al. |
| 2010/0291431 A1 | 11/2010 | Shih et al. |
| 2011/0050159 A1 | 3/2011 | Nieh et al. |
| 2011/0076550 A1 | 3/2011 | Liang et al. |
| 2011/0094094 A1 | 4/2011 | Li et al. |
| 2011/0111296 A1* | 5/2011 | Berdichevsky et al. ... 429/218.1 |
| 2011/0270477 A1 | 11/2011 | Ueki |
| 2011/0274850 A1* | 11/2011 | Yang et al. ............... 427/453 |
| 2012/0003520 A1 | 1/2012 | Lee et al. |
| 2012/0034502 A1 | 2/2012 | Nieh et al. |
| 2012/0080940 A1 | 4/2012 | Larsen |
| 2012/0251867 A1 | 10/2012 | Krasnov et al. |
| 2012/0268057 A1 | 10/2012 | Wu |

FOREIGN PATENT DOCUMENTS

| | | |
|---|---|---|
| EP | 1 353 429 A | 10/2003 |
| EP | 1 458 037 A | 9/2004 |
| EP | 1 415 355 | 1/2009 |
| FR | 2 403 652 A | 4/1979 |
| GB | 2251119 A | 6/1992 |
| JP | 59-032023 A | 2/1984 |
| JP | 59-226472 A | 12/1984 |
| JP | 60-072168 | 4/1985 |
| JP | 61195563 A | 8/1986 |
| JP | 64-54673 * | 3/1989 |
| JP | 04-295015 | 10/1992 |
| JP | 09-259929 A | 10/1997 |
| JP | 2001-044073 A | 2/2001 |
| JP | 2002-165258 | 6/2002 |
| JP | 2002-313289 | 10/2002 |
| JP | 2003-249199 A | 9/2003 |
| JP | 2009123516 | 6/2009 |
| WO | WO-95/14311 A | 5/1995 |
| WO | WO-98/08672 A1 | 3/1998 |
| WO | WO-99/23714 | 5/1999 |
| WO | WO-99/52589 A1 | 10/1999 |
| WO | WO-00/60689 A | 10/2000 |
| WO | WO-01/73873 A | 10/2001 |
| WO | WO-02/061828 A2 | 8/2002 |
| WO | WO-02/021627 A3 | 1/2003 |
| WO | WO-02/042516 A3 | 1/2003 |
| WO | WO-03/061049 A | 7/2003 |
| WO | WO-03/073531 A3 | 12/2003 |
| WO | WO-03/005477 A3 | 12/2004 |
| WO | WO-2004/111659 A2 | 12/2004 |
| WO | WO-2006/042357 A1 | 4/2006 |
| WO | WO-2006/105188 A1 | 10/2006 |
| WO | WO-2006/105050 A3 | 3/2007 |
| WO | WO-2007/042394 | 4/2007 |
| WO | WO-2008/004851 A1 | 1/2008 |
| WO | WO-9820184 A1 | 5/2008 |
| WO | WO-2008/101254 | 8/2008 |
| WO | WO2008101254 | 8/2008 |
| WO | WO-2008/108999 A3 | 11/2008 |
| WO | WO-2008/134053 A1 | 11/2008 |
| WO | WO-2009/052683 A1 | 4/2009 |
| WO | WO-2009/073150 | 6/2009 |

OTHER PUBLICATIONS

PCT International Search Report in Application No. PCT/US2008/013213 (WO 2009/073150 A1), mailed Jun. 18, 2009.

Mattox, Donald M., Handbook of Physical Vapor Deposition (PVD) Processing, Film Formation, Adhesion, Surface Preparation and Contamination Control, 1998, pp. 127-135 and 343-364, Noyes Publications, Westwood, New Jersey, USA.

Roh et al., "Effects of Deposition condition on the ionic conductivity . . . " Scripta Materialia, Dec. 17, 1999, pp. 43-49, vol. 42, No. 1, New York, NY.

Bolster et al., "Investigation of lithium intercalation metal oxides for thermalbatteries" Proceedings of the 34th Int'l Power Source Symposium, Jun. 25-28, 1990, pp. 136-140.

Liang et al., U.S. Appl. No. 13/830,550, filed Mar. 14, 2013, for Localized Heat Treatment of Battery Component Films.

PCT International Search Report in Application No. PCT/US2011/046674 dated Feb. 17, 2012.

Bates et al., "Preferred orientation of polycrystalline LiCoO2 films" J. of the Electrochemical Society (2000), pp. 59-70, Issue No. 147(1).

Wagner et al., "Fabrication and Testing of thermoelectric thin film devices" 15th Int'l Conf. on Thermoelectrics, Mar. 26-29, 1996, pp. 269-273.

Neudecker et al., "Lithium-Free Thin-Film Battery . . . " Journal of the Electrochemical Society (2000), pp. 517-523, Issue No. 147 (2).

Park et al., "Characterization of tin oxide/LiMn2O4 thin-film cell," Journal of Power Sources, Jun. 2000, pp. 250-254, vol. 88, No. 2, Elsevier Science S.A.

PCT International Preliminary Report on Patentability, Application No. PCT/US2008/013213 (WO09/073150), Mailed Jun. 10, 2010.

PCT International Search Report in Application No. PCT/US2012/063100, mailed Feb. 28, 2013.

Liang, U.S. Appl. No. 13/434,775, filed Mar. 29, 2012, for Localized Heat Treatment of Battery Component Films.

Shih et al., U.S. Appl. No. 13/652,416, filed Oct. 15, 2012, for Lithium Battery Having Low Leakage Anode.

Shih et al., U.S. Appl. No. 13/662,842, filed Sep. 25, 2012, for Solid State Battery Having Mismatched Battery Cells.

Shih et al., U.S. Appl. No. 13/333,969, filed Dec. 21, 2011, for Laminated Lithium Battery.

Liang et al., U.S. Appl. No. 13/337,031, filed Dec. 23, 2011, for Sputtering Lithium-Containing Material With Multiple Targets.

Liang et al., U.S. Appl. No. 13/278,082, filed Oct. 20, 2011, for Localized Heating of Thin Film Battery Packaging.

* cited by examiner

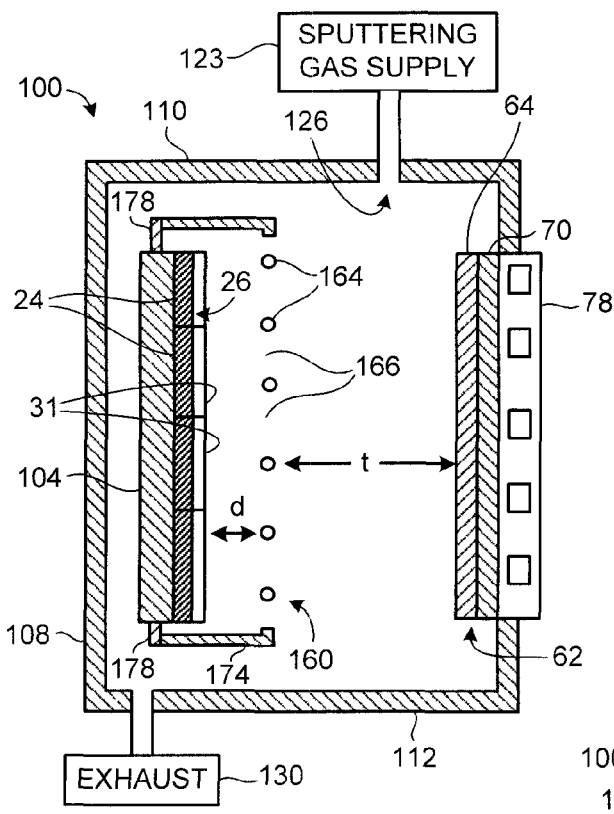
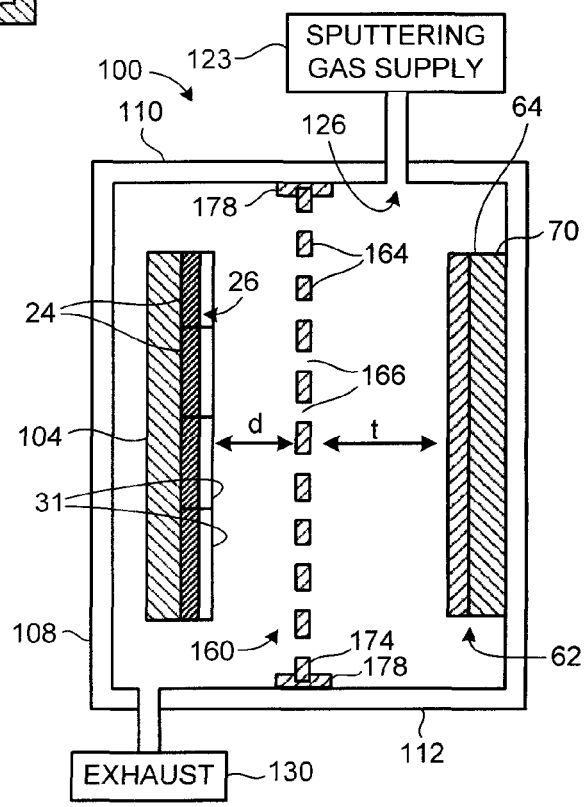
FIG. 3A
FIG. 3B

PLASMA DEPOSITION ON A PARTIALLY FORMED BATTERY THROUGH A MESH SCREEN

BACKGROUND

Embodiments of the present application relate to apparatus and methods for the plasma deposition of material on partially formed batteries.

Rechargeable batteries such as solid state and thin layer batteries are used to supply stored energy in many applications, including portable electronics, automobiles, cordless tool applications, medical devices, and even space systems. Thin layer rechargeable batteries have thin layers with thicknesses of less than 100 microns. Thin layer batteries are used in applications requiring a small size, high specific energy or energy density, and resistance to environmental degradation. Such solid state, thin layer batteries can have battery component layers that can include one or more current collectors, a cathode, an anode and an electrolyte, and which cooperate to store energy. One or more of the battery component layers, such as for example the electrolyte, cathode and anode, are composed of metal-containing materials that contain charge-carrying metal species that migrate during charging and discharging of the battery to store or release electrical energy.

The battery component layers are formed on the battery support by fabrication processes that include plasma processes, such as for example, sputtering, plasma-assisted evaporation, and plasma-enhanced CVD processes. In plasma processes, plasma ions and electrons in the plasma generate localized electrical fields on or near the exposed surface of the battery support. It has been discovered that when plasma processes are used to deposit material onto a partially fabricated battery cell, the localized electrical fields cause migration of the battery charge carrying metal ions within the battery component layers and from the underlying battery component layers of the battery cell to the exposed surface of the battery cell. The accumulated ions result in precipitated elemental metals and metal compounds on the exposed surface of the battery cell, and metal ion depleted regions in the battery cell, all of which reduce battery performance.

As one illustrative example, in lithium batteries, some of the battery component layers are composed of a lithium-containing material such as lithium metal oxide or lithium-containing compound. For example, the cathode can be composed of lithium cobalt oxide, the electrolyte of lithium phosphorus oxynitride, and the anode of elemental lithium. When a partially fabricated battery cell is exposed to the plasma, the resultant surface electrical field drives lithium ions to move inside, or in and out of, the lithium containing materials. The resultant depletion of lithium ions caused the electrical properties of underlying and sputtered layers to degrade during the sputtering process. For example, the cathode of lithium cobalt oxide had substantially lower efficiencies when depleted of lithium ion. Lithium precipitated in the electrolyte layer or on the electrolyte layer surface also degraded electrolyte quality.

For various reasons that include these and other deficiencies, and despite the development of various battery fabrication processes and apparatus, further improvements in the plasma processing of battery component layers are continuously being sought.

SUMMARY

A plasma deposition method can be used for depositing a battery component material on a partially fabricated battery cell in a plasma deposition zone. A battery support comprising at least one partially fabricated battery cell, is providing in the plasma deposition zone. The partially fabricated battery cell comprises a battery component layer containing charge-carrying metal species and having an exposed surface. A mesh screen is maintained at a preset distance from the exposed surface of the battery component layer of the partially fabricated battery cell, the mesh screen having a plurality of mesh openings. A pressure of a process gas is maintained in the plasma chamber. The process gas is energized to form a plasma by applying an electrical power to the process gas to deposit the battery component material onto the exposed surface of the battery component layer. The mesh screen reduces migration of the charge-carrying metal species across the battery component layer.

A plasma chamber for depositing a battery component layer on a partially fabricated battery cell. The chamber comprises a support carrier to hold a battery support comprising at least one partially fabricated battery cell, the partially fabricated battery cell comprising a battery component layer containing charge-carrying metal species and having an exposed surface. A mesh screen is positioned at a preset distance from the support carrier, the mesh screen having a plurality of mesh openings, and the mesh screen being electrically charged, grounded or floating. A gas distributor is provided to introduce a process gas into the plasma chamber. An exhaust maintains a pressure of the process gas in the plasma chamber. A plasma power source is capable of applying an electrical power to the process gas to generate a plasma from the process gas. During plasma deposition, the mesh screen is capable of reducing migration of the charge-carrying metal species across the battery component layer.

A sputtering chamber comprises a sputtering target comprising a sputtering member composed of a battery component material. A support carrier faces the sputtering target, the support carrier being adapted to hold a battery support comprising a partially fabricated battery cell having at least one battery component layer, the battery component layer containing charge-carrying metal species and having an exposed surface. A mesh screen has a plurality of mesh openings, and is positioned at a preset distance of at least 1 cm and less than 20 cm from the support carrier. A gas distributor introduces a process gas into the plasma chamber. An exhaust is provided to maintain a pressure of the process gas in the sputtering chamber. A plasma power source applies an electrical power to the sputtering target to form a sputtering plasma to sputter the battery component material off the sputtering target and onto the battery component layer of the partially fabricated battery cell.

A sputtering method comprises providing in a sputtering zone, at least one sputtering target comprising a sputtering member composed of a battery component material. A battery support comprising a partially fabricated battery cell having at least one battery component layer is held in the sputtering zone. The battery component layer contains a charge-carrying metal species and has an exposed surface. A mesh screen is maintained at a preset distance from the battery support, the mesh screen having a plurality of mesh openings. A pressure of a process gas is maintained in the sputtering chamber. The process gas is energized by applying an electrical power to the sputtering target to sputter deposit the battery component material onto the battery component layer of the battery cell.

A plasma evaporation chamber comprises an evaporation source, a support carrier facing the evaporation source, a mesh screen, a gas distributor, an exhaust and a plasma power source. The evaporation source comprises a crucible containing a source material composed of a battery component material. The support carrier faces the evaporation source and is adapted to hold a battery support comprising a partially fabricated battery cell having at least one battery component layer, the battery component layer containing charge-carrying metal species and having an exposed surface. The mesh screen has a plurality of mesh openings, and is positioned at a preset distance of at least 1 cm and less than 20 cm from the support carrier. The gas distributor is provided to introduce an inert gas into the plasma chamber, the exhaust is provided to maintain a pressure of the inert gas in the plasma evaporation chamber, and the plasma power source is provided to apply an electrical power to a coil and form a plasma.

DRAWINGS

The features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 3A is a sectional schematic side view of a mesh screen attached to a support carrier, the mesh screen comprising a wire grid having a plurality of mesh openings;

FIG. 3B is a sectional schematic side view of a mesh screen attached to the lower and upper walls of a chamber, the mesh screen comprising a sheet having a plurality of mesh openings;

DESCRIPTION

Figure 1A:
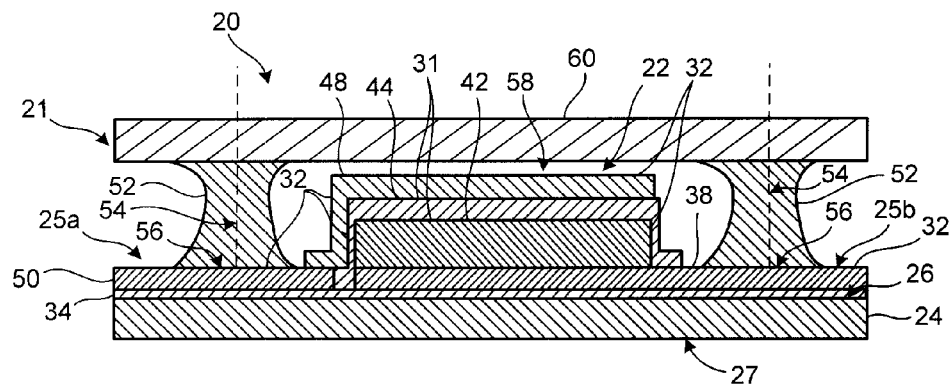
FIG. 1A is a sectional side view of an embodiment of a lithium battery comprising a battery cell on a battery support.
Figure 1B:
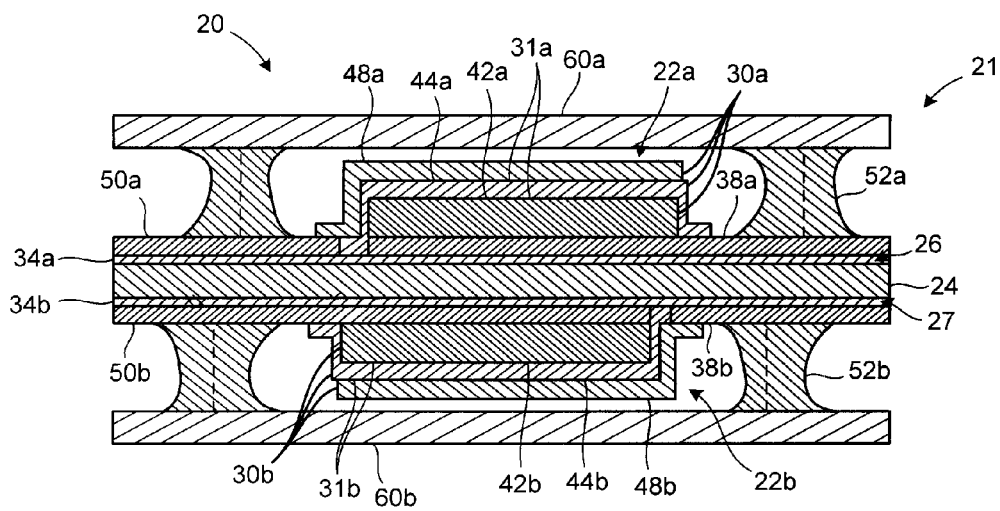
FIG. 1B is a sectional side view of another embodiment of a lithium battery comprising a first battery cell on a first surface of a battery support and a second battery cell on a second surface of the same battery support.

Exemplary embodiments of a rechargeable battery 20 having a protective casing 21 enclosing one or more battery cells 22 or 22a,b, which can be fabricated using a process and apparatus according to the present invention, are shown in FIGS. 1A and 1B. The protective casing 21 protects the battery cell 22 from degradation in the external environment. The battery support 24 comprises a material that has low permeability to oxygen, water vapor, carbon monoxide, carbon dioxide and the like. The battery support 24 should also have a relatively smooth surface and sufficient strength to support battery cells 22 at conventional fabrication or operational temperatures. For example, the battery support 24 can comprise aluminum, aluminum oxide, metal foil, metalized plastic layer, mica, quartz, or steel. In one version, the battery support 24 comprises a first surface 26 and a second surface 27 both of which are planar, or even flat and smooth. One desirable type of battery support 24 comprises a crystalline sheet formed by cleaving the planes of a cleavable crystalline structure, such as mica or graphite. Terminals 25a,b extend out of the protective casing 21 of the battery 20. The exemplary versions of the battery 20 illustrated herein are provided to demonstrate features of the battery and illustrate processes of fabrication; however, it should be understood that these exemplary battery structures should not be used to limit the scope of the invention, and alternative battery structures as would be apparent to those of ordinary skill in the art are within the scope of the present invention.

Referring to FIG. 1A, the battery cell 22 includes battery component layers 30 that cooperate to form a battery capable of receiving, storing, and discharging electrical energy. The battery component layers 30 include one or more metal-containing layers 31 which contain charge-carrying metal species. The metal-containing layers 31 comprise 100 an elemental metal or metal-containing compounds. The charge-carrying metal species are metal ions that migrate within or across one or more of the metal-containing layers 31 to carry charge across the battery cell 22. When the charging current is applied across the battery cell 22, the charge-carrying metal species migrates from the cathode 42, through the electrolyte 44 and accumulate in or about the anode 48 to store electrical charge. Conversely, when an electrical load is applied across the battery cell 22, the accumulated charge-carrying metal species in the anode 48 migrate to the cathode 42 to release electrons. For example, in a lithium battery comprising a cathode 42 composed of $LiCoO_2$, and electrolyte 44 comprising LiPON, and an anode 48 comprising lithium, during the charging process, lithium ions travel from the cathode 42 through the electrolyte 44 to accumulate in the anode 48. In the same batteries, if the anode 48 is made from copper instead of lithium, the lithium metal ions travel out of the cathode 42 during the charging process to accumulate and form a lithium anode layer on the copper anode; whereas, during the discharging process the accumulated lithium ions in the lithium anode layer return to the cathode 42.

The battery component layers 30 include an adhesion layer 34 which is deposited on the first surface 26 of the battery support 24, such as, for example, a metal or metal compound, such as for example, aluminum, cobalt, titanium, other metals, or their alloys or compounds thereof; or a ceramic oxide such as, for example, lithium cobalt oxide. The battery component layers 30 also include at least a pair of electrodes 32 on either side of an electrolyte 44 deposited on the adhesion layer 34, both the electrodes 32 and electrolyte 44 being metal-containing layers 31 that contain the charge-carrying metal species. The electrodes 32 can be any one of a cathode current collector 38, cathode 42, anode 48, and anode current collector 50, which are all interchangeable and can be designed to replace one another. The cathode current collector 38 and anode current collector 50 can be composed of a metal, such as for example, aluminum, copper, platinum, silver, or gold. The cathode 42 can be composed of lithium metal oxide, such as for example, lithium cobalt oxide, lithium nickel oxide, lithium manganese oxide, lithium iron oxide, or even lithium oxides comprising mixtures of transition metals such as for example, lithium cobalt nickel oxide. The anode 48 can be made from a metal such as for example copper. The battery component layers 30 can have, for example, thicknesses of from about 0.1 microns to about 100 microns. The protective casing 21 can include a polymer 52 covering one or more of the side perimeter surfaces 54 that extend along the perimeter 56 of the battery 20, as well as the top surface 58 of the battery 20. The casing 21 can also include a cover 60 which covers the top surface 58 of the battery 20.

In the version shown in FIG. 1B, the battery 20 comprises a first battery cell 22a on an adhesion layer 34a deposited on the first surface 26 of the battery support 24 and a second battery cell 22b on an adhesion layer 34b on the second surface 27 of the battery support 24. While single battery cells 22a,b are shown, it should be understood that more than one battery cell 22a or 22b can be arranged horizontally across the top or second surfaces 26, 27, respectively, of the battery support 24. Each battery cell 22a,b comprises a plurality of battery component layers 30a,b that include an adhesion layer 34a,b; cathode current collector 38a,b; cathode 42a,b; electrolyte 44a,b; anode 48a,b; and second or anode current collector 50a,b, respectively. This version of the battery 20 having two opposing cells 22a,b can be formed using the same processes used to form the battery 20 with the single cell 22 shown in FIG. 1A, by flipping over the battery support 24 to form the battery layer components 30b of the second battery cell 22b, during or after processing of the first battery cell 30a. Alternatively, the battery layer components 30b of the second battery cell 22b can be formed simultaneously with the battery layer components 30a of cell 22a, using a plasma chamber having plasma sources on either side of the battery support 24. In this battery 20, the protective casing 21 includes two layers or beads of polymer 52a,b covering the two battery cells 22a,b, respectively, as well as two covers 60a,b.

Figure 2A:
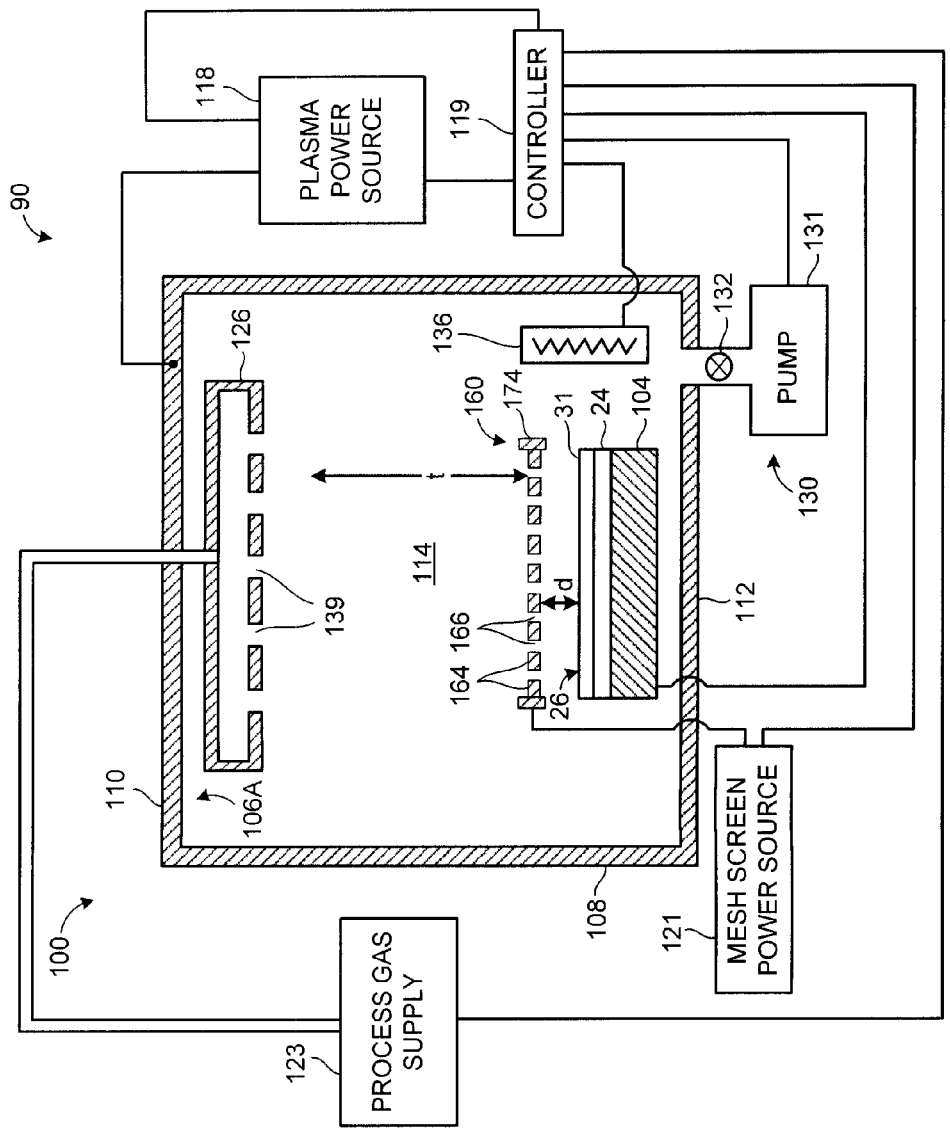
FIG. 2A is a sectional side schematic view of a plasma deposition apparatus comprising a plasma chamber having a mesh screen at a preset distance from an exposed surface of a battery support held on a support carrier.

The metal-containing layers 31, 31a,b that form some of the battery component layers 30 of each battery cell 22, are deposited onto a battery support 24 by a plasma deposition method conducted in a plasma deposition apparatus 90, an exemplary version being shown in FIG. 2A. The plasma deposition apparatus 90 comprises a plasma chamber 100 comprising a sidewall 108, upper wall 110 which may be a ceiling, and lower wall 112, all of which enclose a plasma deposition zone 114. The chamber sidewall 108 can be electrically isolated from the upper wall 110 and the lower wall 112 and can be electrically grounded. The chamber walls 108, 110 and 112, are usually electrically connected and grounded.

Process gas is introduced into the chamber via gas holes 139 of a gas distributor 126, which is connected to a process gas supply 123 which can include compressed gas cylinders, flow meters, valves, and other flow control equipment. The process gas contains one or more gases that can be energized to form a plasma to deposit material onto the battery support 24 by for example, evaporation, chemical vapor deposition or sputtering. The process gas can also be a cleaning gas capable of forming a cleaning plasma, such as an inert gas such as for example argon, to clean process residues from the inner surfaces of the chamber 100. The chamber 100 can be evacuated to a preset pressure by a gas exhaust 130 comprising one or more vacuum pumps 131 and a throttle valve 132, to maintain a pressure of the process gas in the plasma chamber 100. For example, the chamber 100 can be evacuated to a preset pressure by the gas exhaust 130 to a pressure of less than about $10 \times 10^{-5}$ Torr, prior to introduction of any process gas. Thereafter, controlled amounts of process gas are introduced into the chamber 100 via the gas distributor 126.

A plasma power source 118 comprising one or more power supplies electrically couples electrical power as an RF, AC or DC voltage to the process gas to energize the process gas to form a plasma in the chamber 100. For example, a plasma can be generated by applying electrical power to process electrodes 106a,b in the chamber 100. The process electrodes 106a,b can include a pair of (i) any of the chamber walls 108, 110, and 112, (ii) the support carrier 104, (iii) a plasma generating device such as a coil 156 or a plate (not shown) and (iv) a sputtering target 62 mounted in the chamber 100. The plasma power can be applied at a voltage level of from about 100 V to about 1200V, or even from about 150 V to about 450 V. The voltage can be provided at a power level of from about 0.5 kW to about 20 kW, or even from about 3 KW to about 10 KW.

In the plasma deposition process, after the chamber 100 is evacuated by the gas exhaust 130, a support carrier 104 is transported into the plasma chamber 100 with one or more battery supports 24 thereon. The support carrier 104 is capable of holding one or more battery supports 24 so that at least one surface 26 of a single or plurality of battery supports 24, or both surfaces 26, 27 of one or more battery supports 24, are exposed to the plasma deposition zone 114. For example, the support carrier 104 can be a rotating carousel or mechanical conveyor. The support carrier 104 is typically fabricated from plates of a metal such as aluminum or stainless steel.

The plasma chamber 100 is controlled by a controller 119 that comprises program code to operate and control the various components of the chamber 100 to deposit battery component layers 30 on a plurality of battery supports 24 in the chamber 100. The controller 119 comprises, for example, a general purpose computer or control electronic box, which has program code to control the gas supply 123, gas distributor 126, exhaust 130 and throttle valve 132, plasma power source 118 to apply a power to the process electrodes 106a,b, or other chamber components.

A mesh screen 160 is maintained a preset distance "d" away from the support carrier 104 so that an exposed surface 165 of the battery support 24 is spaced apart a predetermined battery-support-separation distance from the mesh screen 160. The distance d between the mesh screen 160 and the underlying support carrier 104 is calculated to provide a set distance between the exposed surface 26 of the battery support 24 and the mesh screen 160. The distance between the deposition source and the exposed surface 26 is typically 3 cm to 30 cm. The mesh should not be too close to the exposed surface 26 because the mesh might be a source for contamination material and the mesh might interfere with the transfer of the support carrier 104. The mesh should also not be too close to the deposition source or the plasma source because the mesh might interfere with the plasma generation process or the deposition process. A suitable distance d has been found to be at least about 1 cm, or even at least about 3 cm; and less than about 20 cm, or even less than about 10 cm.

The mesh screen 160 can be attached to the support carrier 104 (FIG. 3A) or any one or more of the chamber walls 108, 110, 112 (FIG. 3B) to provide a preset distance between the support carrier 104 and the mesh screen 160 as shown in FIG. 3A. This facilitates setting the mesh screen 160 at the correct distance d away from the exposed surface 26 of the battery support 24 and also allows adjusting the distance to compensate for battery supports 24 having different thicknesses. The mesh screen 160 can be supported by a frame 174 which extends across a portion, or the entire perimeter, of the mesh screen 160. The frame 174 can be extendible and directly attached to the support carrier 104 or the chamber walls 108, 110, 112 by battery supports 178 that extend out of the screen. The frame 174 can be made from the same material as the mesh screen 160 or a different material. When the mesh screen 160 is mechanically attached to any one or more of the sidewall 108, upper wall 110, or lower wall 112, the mesh is electrically isolated from these chamber walls.

The mesh screen 160 comprises a solid grid 164 having a plurality of mesh openings 166 that allow certain first species to travel therethrough while impeding or blocking the travel of, or neutralizing the charge carried by second species. The charged species can be formed from the process gases, or the sputtered materials. The solid grid 164 is composed of an electrically conductive material, such as a metal-containing material, for example, elemental metal or an electrically conducting metal compound. The metal-containing material can be one that is resistant to corrosion in the sputtering plasma environment. Suitable metal-containing materials for the mesh screen 160 include elemental metals, such as for example, copper or nickel; or metal alloys such as stainless steel. In one version, the mesh screen 160 is made from copper or stainless steel whichever does not react with the plasma species, and both of which also have good electrical conductivity to transfer electrons to charged species that impinge thereon as explained below.

Figure 4A:
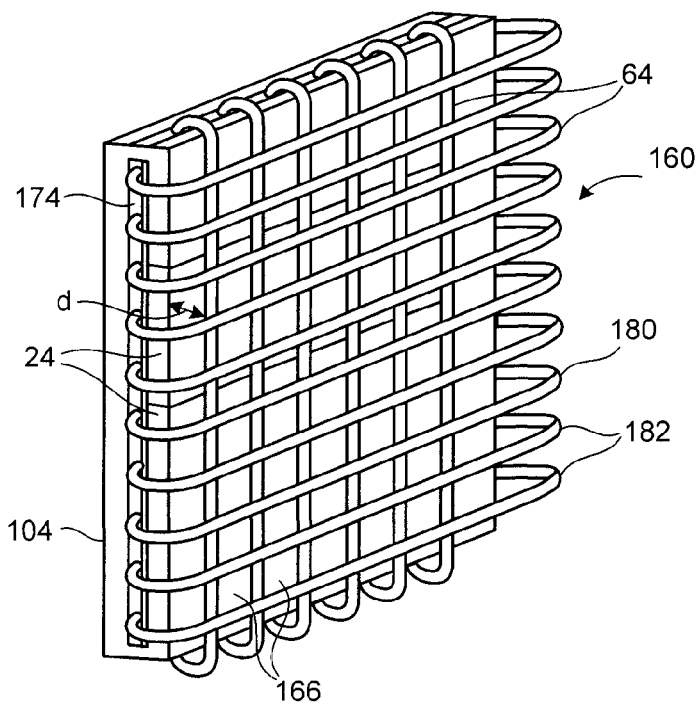
FIG. 4A is a perspective view of a mesh screen comprising a wire grid having wires positioned to overlap one another to define mesh openings therebetween.

In one version, the solid grid 164 is a wire grid 180 comprising wires 182 which are positioned overlapping one another to define the mesh openings 166 therebetween, as shown in FIG. 4A. In this version, the mesh opening size of each mesh opening 166 is achieved by spacing the wires 182 apart by suitable mesh opening distance. The wires 182 can have a thickness, such as a width or diameter, of at least 10 micro meter, or even from about 30 micro meter to about 100 micro meter. The thickness or the diameter of the wires is selected so that the wire is mechanically strong enough to maintain the shape in the plasma and not to reduce the mesh opening area too much. A properly designed mesh can be about 80 to 90% transparent for the neutral species and block most the charged species. The wires 182 are sized to cover the length of the mesh screen 160 or can be sized smaller. In one version, the wires 182 have a length of at least 10 cm, or even a length of from about 30 to about 100 cm. Suitable wires are composed of a conducting metal-containing materials, such as elemental metals or metal compounds, for example, copper or nickel. The wires can be bonded at their overlapping joints using welding or brazing.

Figure 4B:
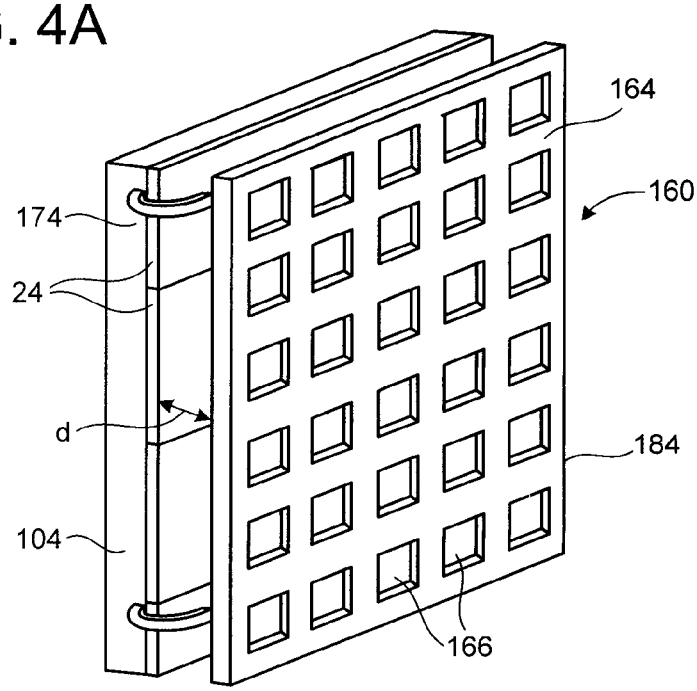
FIG. 4B is a perspective view of a mesh screen comprising a solid sheet having mesh openings cut therein.

The mesh screen 160 can also be formed by cutting the mesh openings 166 into a solid sheet 184 as shown in FIG. 4B. A suitable thickness for the solid sheet 184 can be at least about 0.05 mm, or even from about 0.1 mm to about 0.3 mm. Suitable stamping, pressing or chemical etching operations can be used to form the mesh openings 166 in the solid sheet 184. The wires 182 or the solid sheet 184 can be made from the aforementioned conducting metal-containing materials, such as elemental metals or metal compounds.

During the plasma process, the mesh screen 160 is maintained at a floating potential, electrically ground, or a positive or negative bias. The mesh screen 160 can be maintained at a floating potential relative to any of the chamber walls 108, 110 and 112, sputtering target 62, or plasma. For example, the mesh screen 160 can be maintained at the floating potential of the plasma by electrically decoupling or isolating the mesh screen 160 from the other chamber components. The mesh screen 160 can be maintained electrically floating absent an external biasing power source.

The mesh screen 160 can also be electrically grounded to maintain a ground potential across the openings 166. In this version, the mesh screen can be electrically coupled to any one of the chamber walls 108, 110, 112 which are also maintained at a ground potential. Conversely, when the chamber walls 108, 110, and 112 are used as process electrodes, the mesh screen 160 can be electrically isolated from the chamber walls and separately electrically grounded.

In still another version, a biasing voltage is applied to the mesh screen 160 by an external mesh screen power source 121. In this version, the mesh screen 160 is electrically isolated from the chamber 100 and its components. The mesh screen power source 121 electrically biases the mesh screen 160 by applying a potential directly to the mesh screen 160 which is decoupled from the support carrier 104. Alternately, the mesh screen power source 121 can electrically bias the mesh screen 160 by applying a potential to the support carrier 104 which is electrically coupled to the mesh screen 160. The applied potential bias can be a separate voltage which is independent from the voltage applied to the battery support 24 via the support carrier 104, or can be the same voltage from the same power source. The applied potential can be a negative or positive voltage relative to a time averaged voltage potential applied to the process electrodes 106a,b or sputtering target 62. The mesh screen power source 112 can be a conventional DC power source, pulsed DC power source, or AC power source. In one embodiment, the mesh screen power source 121 applies an external DC voltage to maintain the mesh screen 160 at a continuous or pulsed DC voltage relative to an inner region of the chamber wall 108, of from about −5 V to about −200V, or even from about −5 V to about −100 V, or even about −20 V.

In yet another version, the support carrier 104 and the battery supports 24 held thereon are biased by a second DC voltage from a substrate power source 124 while the mesh screen 160 is biased at a first DC voltage by the mesh screen power source 121. A suitable second DC voltage from the substrate power source 124 is a pulsed DC voltage of from about −5 V to about −20 V, pulsed at a rate of from about 1000 to about 10,000 Hz. The first DC voltage applied to mesh screen 160 is independent of a second DC voltage applied to the battery supports 24, and a suitable first DC voltage is from about −5 V to about −50 V.

In operation, it is believed that the mesh screen 160 allows charge-neutral sputtered species to pass through its mesh openings 166 while neutralizing, impeding the passage of, or repelling and blocking, charged plasma species of sputtered material or ionized gas species to deposit a layer having a higher quality microstructure onto a battery support 24. The charged plasma species are either neutralized when they strike, or repelled by, the floating, grounded, or DC biased mesh screen 160. For example, when the mesh screen 160 is maintained at a floating, ground or negative voltage potential, electrons are repelled by the solid grid 164 while positively charged plasma species (such as nitrogen ions in a sputtering plasma or argon ions in a CVD process, or argon ions in an evaporative process) are attracted to the solid grid 164 to release electrons and become neutralized species. As a result, the sputtered species passing through the mesh screen 160 are primarily composed of neutral or charge neutralized plasma species.

It was discovered that the electrical potential generated by the accumulated charged plasma species on the exposed surface of the partially built battery cell 22 causes charged lithium ions from the underlying battery component layers 30 to migrate across any one of the battery component layers 30.

The surface region of a partially made battery cell 22 contains different battery component layers 30 made of different materials, such as any one or more of the cathode and anode current collectors 38, 50, respectively, cathode 42, electrolyte 44, and the battery support 24. The electrical properties of these layers can be substantially different from one another. Thus when layers of such different materials are exposed to the energized species and ions of a plasma, different electrical potentials are established in the different layers. The different electrical potentials in different layers generate an electrical potential between the different layers. The charged species, such as lithium ions, in the battery component layers 30 migrate and move to undesirable levels or layers of the battery cell 22 as a result of (i) the electrical potential established between the different layers and the plasma, and/or (ii) the electrical potential between battery component layers 30. The migrating charged species can originate from the battery component layers 30 themselves, such as the metal-containing layers of the battery cell 22. The charge-carrying metal species can migrate across different battery component layers 30 and even accumulate on the exposed surface 65 of the top-most battery component layer 30.

Migration of charged species from underlying battery component layers 30 results in net depletion of the species from underlying battery component layers 30, which lowers battery performance, including battery capacity and cycle life. Still further, accumulation of the migrating charged species on the exposed top-most surface of the battery cell 22 is undesirable. The accumulated species can also react with the process gas or plasma to create undesirable compounds on the exposed surface. For example, in a lithium battery, positively lithium ions migrate from metal-containing battery component layer(s) of the partially fabricated battery cell 22 to the exposed surface, and once thereon, absorb an electron to become lithium metal atoms. The lithium metal atoms can react with the plasma or with gases such as nitrogen or oxygen to form undesirable compounds such as lithium nitride, lithium oxide or lithium oxy-nitride compounds. These compounds form a layer or particles which reduce the performance of the fully fabricated battery cell 22.

In contrast, the mesh screen 160 primarily allows only neutral sputtered species to pass through its mesh openings 166 while neutralizing or repelling the charged species. Thus, primarily only neutral sputtered species deposit and accumulate on the exposed surface of the battery component layer 30 of the battery support 24. The neutral or neutralized species do not cause migration of lithium ions from the underlying battery component layers 30, and as a result these ions are not depleted from the underlying layers 30 and do not react with the process gases in the chamber 100 to form undesirable layers on the exposed surface of the battery support 24. In this manner both lithium ion depletion, and build up of undesirable surface compounds is prevented, resulting in better performing battery cells 22.

The dimensions, open area of each opening, and the total open area of the mesh openings 166 is important. If the dimension of each of the mesh openings 166 is too big, ions and electrons from the plasma leak through the mesh screen 160 and reach the battery support 24. Conversely, if the mesh opening 166 is too small, the transparency for the neutral species is reduced, leading to a reduction in deposition rate. Further, if open area of each opening 166, or the total mesh opening area are too large, the charged sputtered species are not effectively neutralized or impeded. If the aerial sizes and total open area are too small, then too few of the sputtered species reach the surface of the battery support 24 resulting in undesirably low deposition rates. Thus, in one version, a suitable mesh opening dimension is about 1 mm to about 5 mm. In the example illustrated, the micromesh screen 160 comprises mesh openings 166 that are square or rectangular, and have a mesh opening dimension that is at least 0.5 mm, or even 1 mm. For example, the mesh opening dimension can be a width or length of a mesh opening 166. However, the mesh openings 166 can be of other shapes, such as circular mesh openings, elliptical mesh openings, or other shapes. In one version, the mesh openings 166 which are circular or elliptical have a diameter or major axis of an ellipse that is at least 1 mm, for example, from about 3 mm to about 5 mm.

Each mesh opening 166 of the mesh screen 160 has an open area of at least $0.5 \text{ mm}^2$, or even from about $5 \text{ mm}^2$ to about $30 \text{ mm}^2$. The total open area of the mesh openings 166 of the mesh screen 160 is at least 70% of the total area covered by the solid grid and 164 of the mesh screen, or even at least about 90%, of the total area of the mesh screen 160. The total or cumulative open area of the mesh openings 166 is the sum of the open area of each of the mesh openings 166. The total area of the mesh screen 160 is the aerial coverage area of the solid grid 164 of mesh screen 160. For example, when the total area of the mesh screen 160 is 10 area units, the cumulative open area of the mesh openings 166 of the mesh screen 160 will be at least 70% of 10, or at least 7 area units.

In one exemplary plasma deposition process, the plasma deposition apparatus 90 comprising the plasma chamber 100 shown in FIG. 2A, can be used for the deposition of carbon anode in a plasma enhanced CVD process. In CVD processes, the process gas comprises gases that form a plasma to deposit a battery component material on the battery support 24. For example, in the CVD deposition of carbon for an anode, a suitable process gas comprises $C_2H_2$. In the CVD process, the process gas is maintained at a pressure of from about 1 mTorr to about 10 mTorr. The process gas is energized by applying an electrical power to the process electrodes which are either (i) the support 104 and one or more of the chamber walls 108, 110 and 112, or (ii) a pair of the chamber walls 108, 110, and 112. The plasma power source 118 applies a power level of from about 500 W to about 5 KW, at an RF frequency of about 13.6 MHz, to energize the process gas.

Figure 2B:
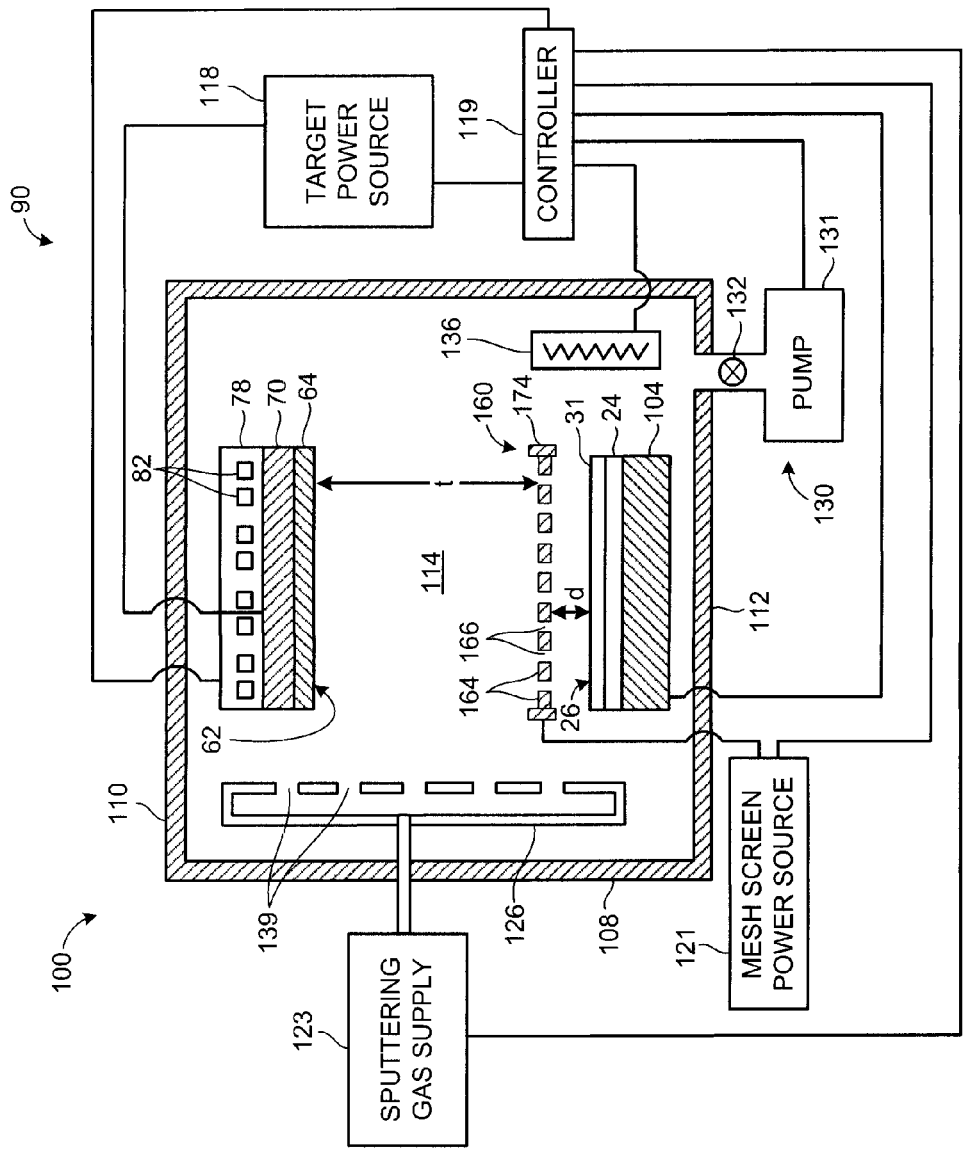
FIG. 2B is a sectional side schematic view of a plasma deposition apparatus comprising a sputtering chamber having a mesh screen between the exposed surface of the battery support and a sputtering target.

In one version, the metal-containing layers 31, 31*a,b* that form some of the battery component layers 30 of each battery cell 22, are sputter deposited onto a battery support 24 by sputtering one or more sputtering targets 62 mounted in a plasma chamber 100 of an apparatus 90, as shown in FIG. 2B. The chamber walls 108, 110 and 112 are usually electrically connected and grounded. Process gas that is a sputtering gas is introduced into the chamber via gas holes 139 of the gas distributor 126, which is connected to the process gas supply 123. The sputtering gas can contain non-reacting gases that can be energized to form a plasma to ionize and sputter material from the sputtering targets 62, and/or can also contain reactive gases that react with sputtered material from a sputtering target 62 to form compounds that deposit on the battery support 24. The chamber 100 is evacuated to a preset pressure by the gas exhaust 130.

One or more sputtering targets 62 that each comprise a backing battery support 70 supporting a metal-containing sputtering member 64 are fastened in the plasma chamber 100 opposing and facing the support carrier 104. The sputtering target 62 is positioned abutting a magnetron 78 which generates a magnetic field about the surface of the sputtering target 62, and is electrically isolated from the chamber wall and connected to the power source 118 to serve as a cathode electrically coupled to the sputtering target 62. The magnetron 78 contains one or more magnets 82, and can be internally mounted inside the chamber 100 or externally mounted.

The sputtering target 62 comprises a metal-containing sputtering member 64 to deposit the metal-containing layer 31 or layers 31a,b onto one or more battery supports 24. The sputtering member 64 can be rectangular, circular or cylindrical in shape, depending on the shape or configuration of the chamber 100 or battery support 24. For example, the metal-containing sputtering member 64 can be composed of a metal such as for example, copper, or a metal compound such as a lithium compound, such as for example, lithium oxide, lithium cobalt oxide, or other lithium compounds. The metal-containing material is selected to obtain the desired composition of a metal-containing layer 31. For example, a cathode 42 of a battery cell 22 can deposited using a metal-containing sputtering member 64 composed of lithium cobalt oxide having the stoichiometric formula $LiCoO_2$. As another example, an electrolyte 44 of a battery cell 22 can deposited using a metal-containing sputtering member 64 composed of lithium, lithium oxide or lithium phosphate. As still another example, an anode 48 of a battery cell 22 can be deposited using a metal-containing sputtering member 64 composed of lithium.

The support carrier 104 is transported into the plasma chamber 100 and positioned facing the sputtering target 62 inside the chamber 100. In the sputtering process, the plasma chamber 100 is controlled by the controller 119 that comprises program code to apply a power to the sputtering target 62 or magnetron 78, and other chamber components. For example, the chamber 100 can be evacuated to a preset pressure by the gas exhaust 130 to a pressure of less than about $10 \times 10^{-5}$ Torr, prior to introduction of any cleaning or sputtering gas. Thereafter, controlled amounts of cleaning or sputtering gas are introduced into the chamber 100 via the gas distributor 126. For example, a cleaning plasma of an inert gas such as argon can also be used to clean residues from the sputtering target 62 and inner surfaces of the chamber 100.

A mesh screen 160 having the structure as previously described is positioned a preset battery support separation distance "d" away from the support carrier 104 so that the exposed surface 26 of the battery support 24 is spaced apart a predetermined distance from the mesh screen 160. In one version, the mesh screen 160 is attached to the support carrier 104 (as shown) or a chamber wall to provide a preset distance between the support carrier 104 and the mesh screen 160.

In an exemplary sputtering process, the process gas is a sputtering gas and can include non-reactive gases, such as argon or nitrogen which ionize to sputter material from a sputtering target 62 to form compounds that deposit on the battery support 24. The sputtering gas can also include reactive gases which react with the sputtered material during deposition to deposit metal compounds onto the batteries 24, such as nitrogen or oxygen. During the sputtering process, the process gas can be maintained at a pressure of from about 1 mTorr to about 10 mTorr.

The sputtering target 62 can contain a metal-containing sputtering member 64 composed of a metal-containing material, such as copper, lithium, $Li_3PO_4$. A DC or RF voltage is applied to the sputtering target depending on the composition of the metal-containing sputtering member 64. For example a DC voltage of from about 500 W to about 3000 W is used for sputtering copper also for the anode 48 or anode current collector 50. As another example, in the sputtering of a sputtering member 64 composed of $Li_3PO_4$ for the deposition of a $Li_3PO_4$ electrolyte 44, an RF voltage is applied to a $Li_3PO_4$ sputtering target 62, the frequency being about 13.6 MHz.

Sputter Deposition of Electrolyte

In the sputtering process, the metal-containing material is sputtered onto an exposed surface of a battery component layer 30 of a partially built lithium battery cell 22 on a battery support 24. In a first exemplary version, a partially fabricated battery cell 22 is formed on a battery support 24 of mica, and includes (i) an adhesion layer 34 of titanium; (ii) a cathode current collector 38 composed of an elemental metal, such as for example, aluminum, platinum, nickel or gold; and (iii) a cathode 42 composed of a lithium metal oxide, namely, lithium cobalt oxide.

In the mesh screen sputtering process, an electrolyte 44 is deposited on the cathode 42. The electrolyte 44 can be, for example, an amorphous lithium phosphorus oxynitride layer, also known as a LiPON layer. In one embodiment, the deposited LiPON material has the stoichiometric formula $Li_xPO_yN_z$, with for example, an x:y:z ratio of about 2.9:3.3:0.46. In this version, the electrolyte 44 is deposited to a total thickness of from about 0.1 to about 10 microns, or even from about 1 to about 5 microns. The electrolyte 44 is deposited by RF magnetron sputtering of a sputtering target 62 having a metal-containing sputtering member 64 comprising elemental lithium. A process gas comprising nitrogen at a flow rate of from about 50 sccm to about 500 sccm is introduced into the chamber 100 via the gas distributor 126, and the chamber pressure is maintained at about 5 mTorr. A plasma is formed by applying a RF voltage at frequency of about 13 MHz and a power level of about 1 KW, to the sputtering target 62 to form a reactive process gas environment in which sputtered lithium species from the sputtering target 62 react with the nitrogen gas to deposit LiPON on the battery support 24.

Thus, in the first example, electrolyte 44 is deposited on a partially built battery cell 22 comprising an exposed surface 165 of a battery component layer 30 that is a cathode 42 composed of lithium cobalt oxide. In conventional sputtering methods, charged plasma species, including electrons, ions of process gas, and ions of sputtered material, can reach the battery support surface and generate an electrical potential, often localized, on the battery support surface 26. Still further, the partially built battery cell 22 comprises an exposed overlying battery component layer 30 comprising a partially deposited electrolyte 44, and an underlying cathode 42 and cathode current collector 38, which is an almost complete battery cell 22.

The potential generated by the accumulated charged species and the overlying plasma serves as the anode of the partially built battery cell, causing positively-charged lithium ions from the cathode material or from the electrolyte to migrate across the thickness of one or both of these battery component layers 30 to reach the cathode/electrolyte interface, or even to reach the exposed surface of the battery cell 22. The resultant lithium deficient cathode or electrolyte layer has poor electrochemical performance. As a result, the performance of the resulting battery cell 22 is degraded because low capacity, or high self-discharge, or poor cycle life. Further, the plasma potential is affected by the RF or AC power applied to the sputtering target 62. This plasma potential change can induce ionic current flow in the half made battery. The ionic current also causes migration of lithium ions to form metallic lithium on the exposed surface of the battery support 24. At the exposed surface 165, the migrated positively charged lithium ions capture electrons to become neutral elemental metallic lithium atoms which react with the process gases, in this case nitrogen or oxygen, to form compounds such as lithium nitride, lithium oxide, or even lithium oxy-nitride. These compounds are undesirable because they can cause local peeling, or become a defect in the electrolyte layer.

In contrast, when a mesh screen 160 is positioned between the sputtering target 62 and the battery support 24, the mesh screen 160 primarily allows only neutral species to pass through its mesh openings 166 while neutralizing or repelling the charged plasma species. The neutral or neutralized species do not promote migration of lithium ions from the underlying battery component layers 30. As a result, fewer lithium ions migrate from the underlying layers 30. Thus the mesh screen 160 reduces migration of the charge-carrying metal species across one or more of the battery component layers 30. Further, less lithium metal forms on the exposed surface 165, or reacts with process gases in the chamber 100 to form undesirable compounds. Thus, both lithium ion depletion and build up of electrically undesirable compounds are prevented, resulting in better performing battery cells 22.

Sputter Deposition of Copper Anode

In a second example, the underlying battery component layer 30 comprises an electrolyte 44, and an anode comprising copper is deposited on the electrolyte 44 in the sputtering process. The anode 48 is deposited by DC sputtering of a sputtering target 62 comprising a metal-containing sputtering member 64 comprising elemental lithium or elemental copper. A process gas comprising argon is introduced into the chamber 100 via the gas distributor 126 at a flow rate of from about 50 sccm to about 500 sccm, and the chamber pressure is maintained at about 5 mTorr. A plasma is formed by applying a DC voltage at a power level of 100 W to 500 W to the sputtering target 62 to form a process gas environment in which sputtered copper species from the target 62 deposit elemental copper on the electrolyte 44 to serve as the anode 48 without causing migration of lithium ions to the exposed surface of the battery support 24.

Again, absent the mesh screen 160, lithium ions migrating from both the electrolyte 44 and the underlying cathode 42 would have accumulated on the exposed surface of the battery cell 22 during the sputtering process. However, with the mesh screen 160 in place, neutral species are incident on the surface of the electrolyte 44 and do not cause migration of lithium ions from the underlying battery component layers 30. Thus, both lithium ion depletion and build up of electrically undesirable surface compounds on the surface of the electrolyte 44 is prevented, resulting in better performing battery cells 22.

Exemplary Sputtering Apparatus

Figure 5A:
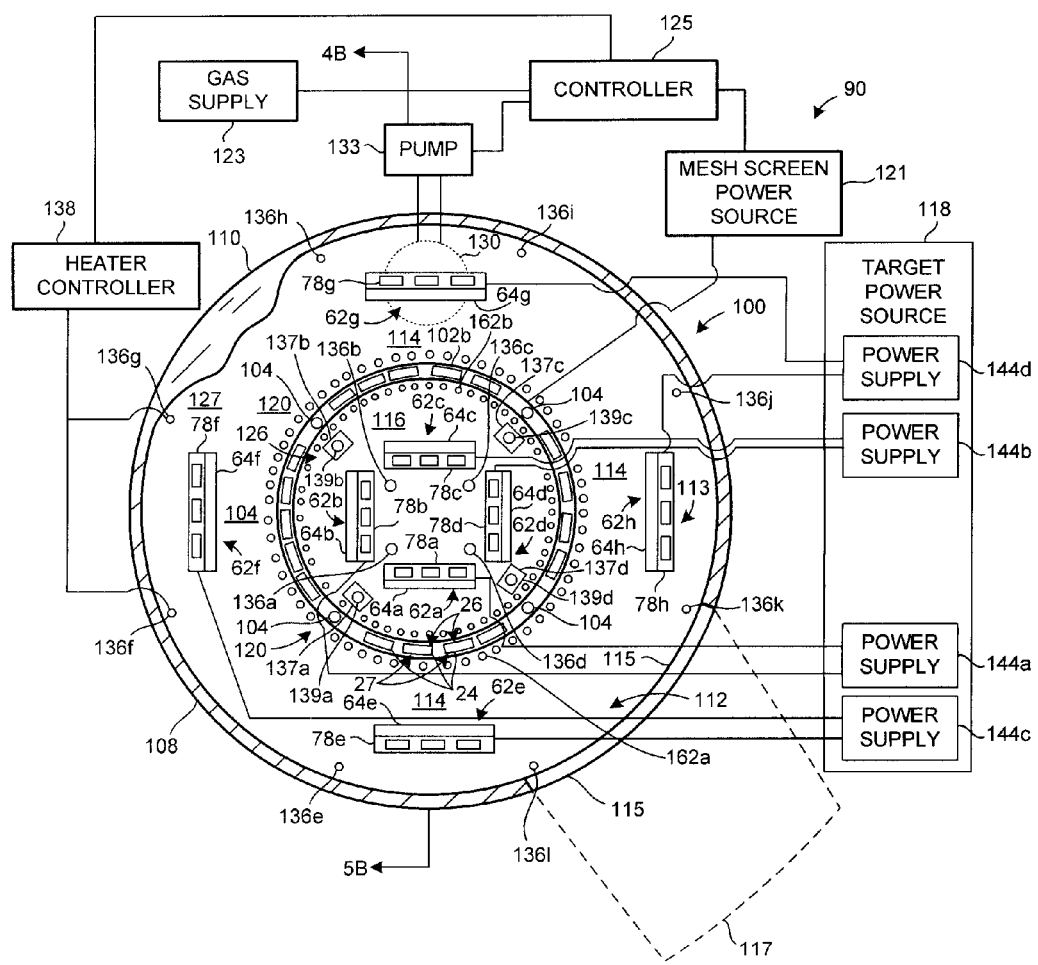
FIG. 5A is a top plan schematic view of an embodiment of a cylindrical magnetron sputtering, plasma chamber.
Figure 5B:
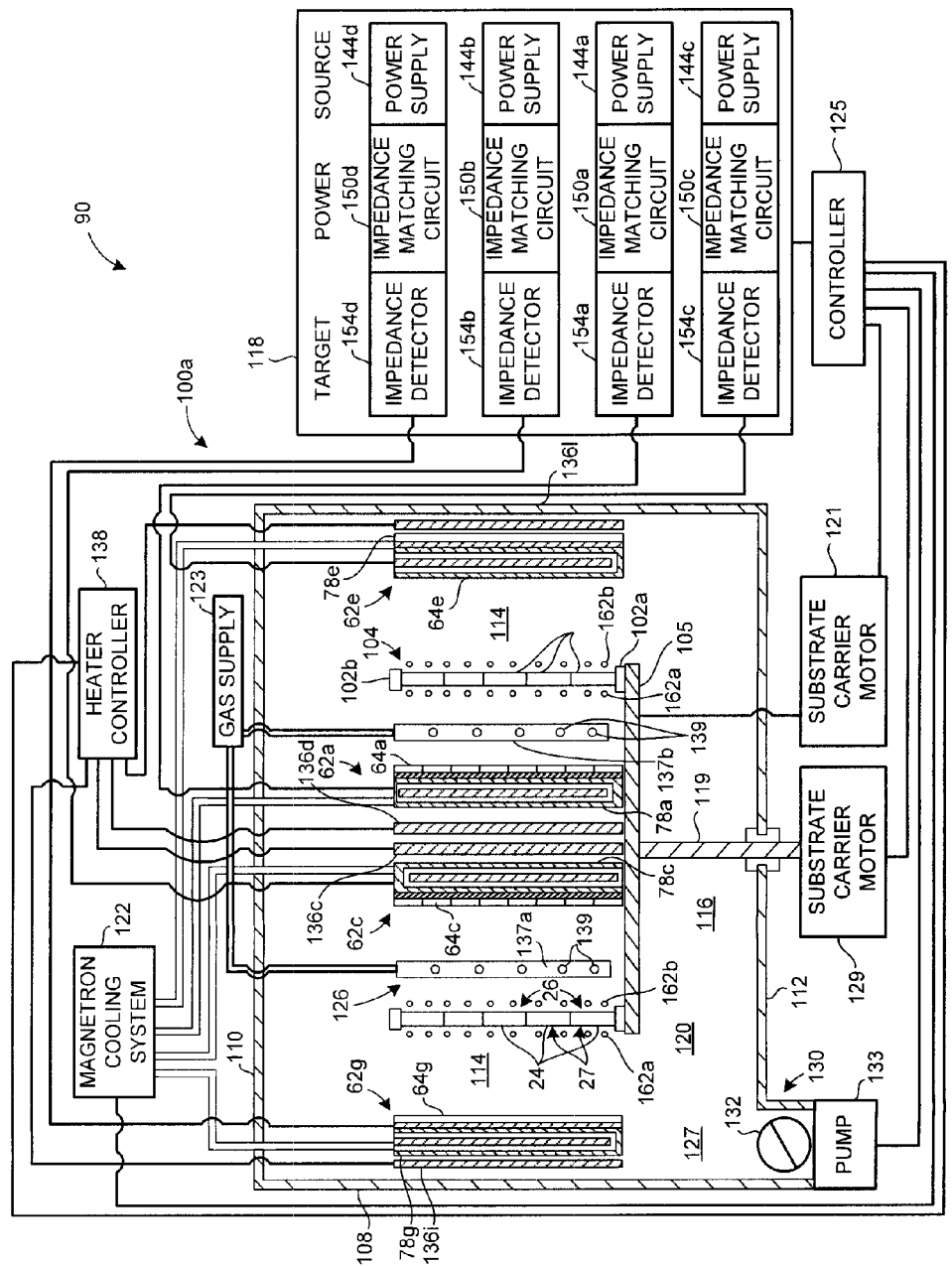
FIG. 5B is a sectional side schematic view of the deposition chamber of FIG. 5A as seen from the direction shown by the arrow 5B in FIG. 5A.

Another exemplary embodiment of a plasma chamber 100a suitable for depositing a metal-containing layer 31 by sputtering a plurality of sputtering targets 62 onto a plurality of battery supports 24 positioned on a support carrier 104 with an overlying mesh screen 160, is shown in FIGS. 5A and 5B. The plasma chamber 100a comprises a circular sidewall 108, a upper wall 110 and a lower wall 112 typically composed of stainless steel or aluminum, which surround and enclose a plasma deposition zone 114. The plasma chamber 100a is joined to a transition mechanism 117 which can be, for example, a chamber, a glove box with controller atmosphere or a clean room in which a support carrier 104 is loaded with a plurality battery supports 24. A gate 115 such as a door or slit valve is used for the passage of a support carrier 104 from the transition mechanism 117 to the chamber 100a and vice versa.

In the chamber 100a, rectangular sputtering targets 62a-h are electrically coupled to adjacent magnetrons 78a-h. Each sputtering target 62a-h comprises a sputtering member 64a-h is composed of 2 to 10 segments of rectangular sputtering plates (not shown). A magnetron cooling system 122 is used to supply deionized water to the housings 80 of each of the magnetrons to cool the magnets 82a-c in each magnetron 78, at a flow rate of from about 5 gallon/min to about 25 gallon/min. A support carrier 104 transported into the plasma chamber 100a holds battery supports 24 so that they are positioned in a circle at a central region 120 of the chamber 100a. The battery supports 24 can be mounted in the support carrier 104 so that either one, or both of, the first and second surfaces 26, 27 of each battery support 24 are exposed to the plasma deposition zone 114 in the chamber 100a. The support carrier 104 comprising two open rings 102a,b joined by struts 103 to expose both the first and second surfaces 26, 27. One of the rings 102a can be joined to a disc 105 so that the support carrier 104 can be rotated during sputtering in the chamber 100a processing to increase deposition uniformity by a support carrier motor 129 connected by an axle 119. For example, the support carrier 104 can be rotated at a rotational rate of at least about 1 rpm or even from about 0.5 to about 5 rpm.

A first mesh screen 160a is positioned a set distance from the support carrier 104 and sputtering targets 62a-d which are positioned in a radially inward region 116. Alternatively or in conjunction, a second mesh screen 160b can be positioned a set distance from the support carrier 104 and the sputtering targets 62e-h in a radially outward region 127. The targets 62a-d are used deposit a metal-containing layer 31 on the exposed surface 26 of the battery supports 24a, and the targets 62e-h are used deposit a metal-containing layer 31 on the exposed surface 27 of the battery supports 24b. The first and second groups of the targets 62a-d and 62e-h can also be used together to deposit material on both surfaces 26, 27 of a single set of battery supports 24.

In operation, process gas is introduced into the chamber 100a by a gas supply 123 which can include compressed gas cylinders, flow meters, valves, and other flow control equipment. The process gas is introduced via a gas distributor 126 comprising a plurality of tubes 137 with gas holes 139. A gas exhaust 130 comprising exhaust vacuum pumps with a throttle valve 132 can be used to control the pressure of the process gas within the chamber 100a. The plasma chamber 100a can include a heater 136 to maintain the battery supports 24 at an appropriate processing temperature.

The sputtering targets 62a-h are electrically coupled via the electrically conducting magnetrons 78a-h to a plasma power source 118 that provides an AC (alternating current), RF, or DC voltage to excite the process gas within the chamber 100a. In the deposition of a conducting material, such as copper, the power source applies a voltage as described above to the sputtering targets 62.

For the deposition of a sputtering target 62 comprising a non-conductor, such as the deposition of a cathode of lithium cobalt oxide from a sputtering target 62 comprising $LiCoO_2$, the plasma power source 118 can include one or more power supplies 144a-d which are each electrically coupled to pairs of adjacent sputtering targets 62a,c or 62b,d or 62e,f or 62g,h via the attached electrically conducting housing of the magnetrons 78a-h, respectively. As one example, when the power supply 144a electrically biases the sputtering target 62a at a negative potential relative to the sputtering target 62c, the sputtering target 62a serves as a cathode while the sputtering target 62c serves as an anode. During sputtering, the momentary sputtering target 62a which operates as a cathode generates secondary electrons which are accelerated towards the target 62c which operates as an anode and neutralizes residual positive surface charges which accumulate in electrically insulating or less conductive portions of the sputtering targets 62a,c during the negative half cycle. The plasma power source 118 provides an AC voltage at a voltage level of from about 200V and about 1200V, or even from about 250V to about 450V. The voltage is provided at a power level of from about 1 kW and about 20 kW, or even from about 3 KW to about 10 KW. The voltage is provided in a mid-frequency level of from about 10 to about 100 kHz, or even at a frequency of from about 20 kHz to about 80 kHz. Impedance matching circuits 150*a,b* can also be connected to whichever of a pair of targets 62*a*, 62*b* has a lower impedance to adjust the impedance of the target 62*a* or 62*b* having the lower impedance to increase its impedance to substantially match that of the higher impedance target.

The plasma chamber 100*a* can be controlled by a controller 119 that comprises program code to operate components of the chamber 100*a* to deposit battery component layers 30 on a plurality of battery supports 24 in the chamber 100*a*. In a sputtering process, the process gas mixture is controlled by first evacuating the chamber 100*a* and then introducing controlled amounts of process gas into the chamber 100*a* via the gas distributor 126.

After cleaning, a support carrier 104 is transported into the plasma chamber 102, electrically isolated from the chamber wall 108. Optionally, the mesh screen power source 121 can be powered to bias the mesh screens 160*a,b*, support carrier 104, and the battery supports 24*a,b* held therein, or the mesh screens 160*a,b* can be maintained at a floating or ground potential. In one version, the battery supports 24 can include from 100 to 1000 battery supports that are each comprise a sheet of mica sized with an area of from about 5 cm$^2$ to about 50 cm$^2$. In one exemplary process, the mesh screen power source 121 maintains the support carrier 104 and mesh screen 160 at a DC voltage of from about −10V to −100V. Alternatively, the DC bias voltage can be a floating potential of the support carrier 104 in the plasma. The battery supports 24 are maintained at a temperature of from about 50° C. to about 300° C. during processing by operating the heater controller 138 which powers the heaters 136*a-l* as needed, noting that the deposition of electrolyte or copper does not need the heater.

After deposition is complete, the support carrier 104 is moved into the transition mechanism 117 and the slit valve 115 closed. The transition mechanism 117 which can be, for example, a chamber, a glove box with controller atmosphere, or a clean room in which a support carrier 104 is loaded with a plurality battery supports 24. A gate 115 is used to open the transition mechanism 117 to insert the loaded support carrier 104 from the outside environment. The transition mechanism 117 is vented and the support carrier 104 removed. The battery supports 24 can now be removed from the support carrier 104 and other battery component layers 30 of battery cells 22 formed on each of the battery supports 24 as needed.

Figure 6A:
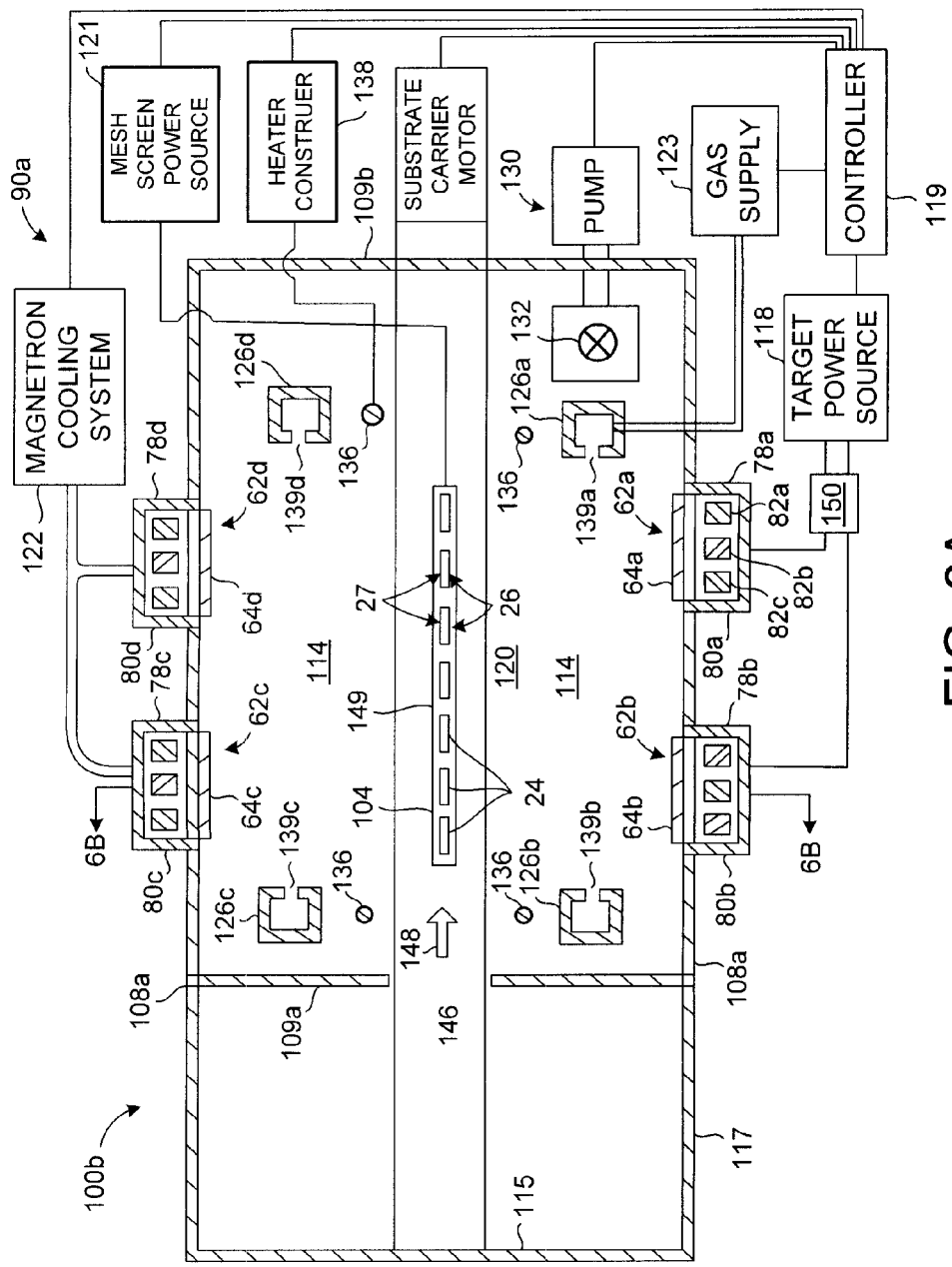
FIG. 6A is a top plan schematic view of an embodiment of a rectangular magnetron sputtering, plasma chamber.
Figure 6B:
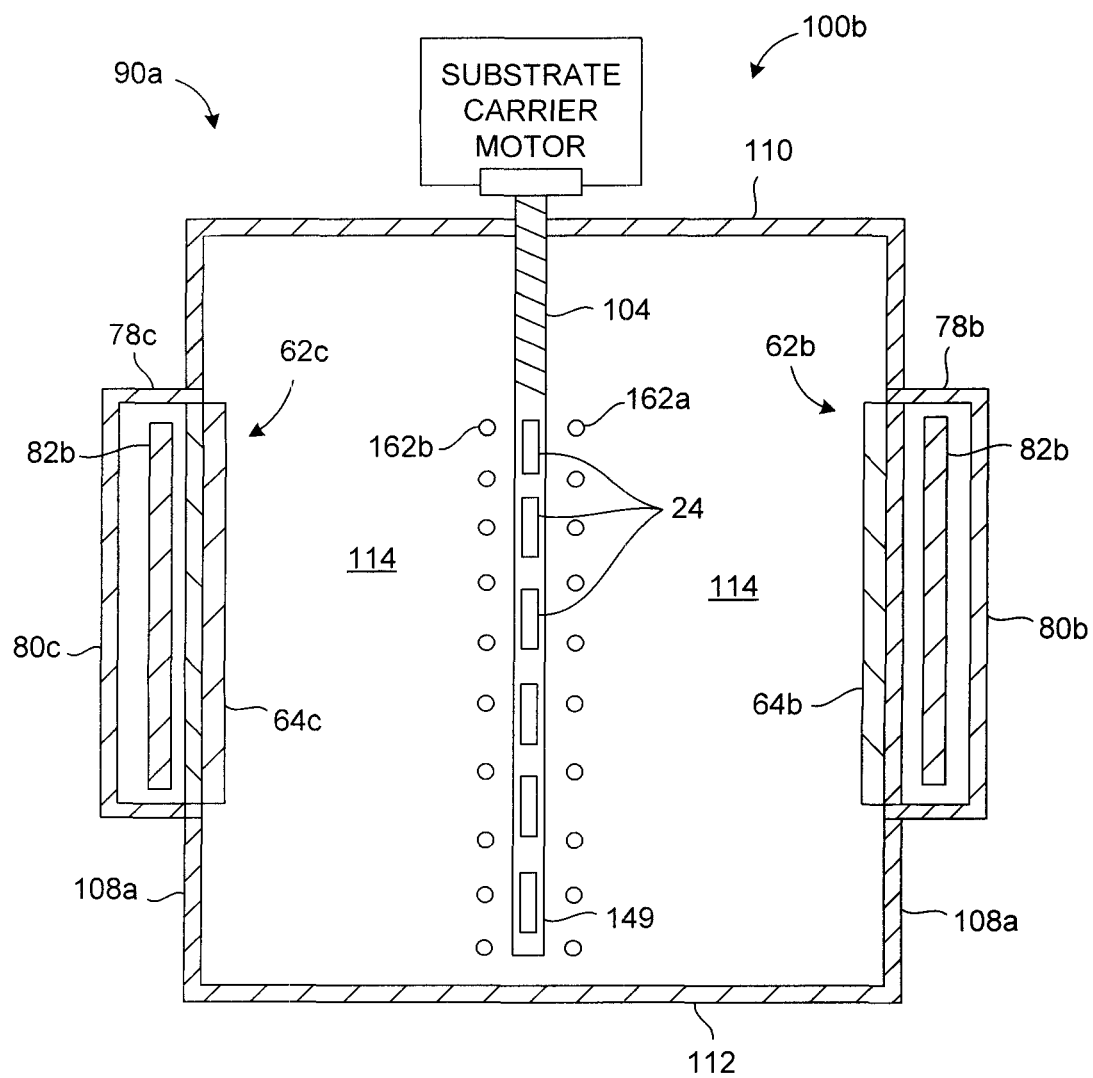
FIG. 6B is a sectional side schematic view of the magnetron plasma chamber of FIG. 6A as seen from the direction shown by the arrow 6B in FIG. 6A.

Still another version of a plasma chamber 100*b* capable of depositing metal-containing layers 31 onto a plurality of battery supports 24 is shown in FIGS. 6A and 6B. In this version, the plasma chamber 100*b* comprises a rectangular sidewall 108*a*, endwall 109*a,b*, upper wall 110 and lower wall 112, which surrounds and encloses a plasma deposition zone 114, and which are typically composed of stainless steel or aluminum. A support carrier 104 is transported by a conveyer 146 in the direction shown by the arrow 148 into, and slowly across, a central region 120 of the chamber 100*b*. The battery supports 24 are mounted in the support carrier 104 so that both the first and second surfaces 26, 27, respectively, of each battery support are exposed to the plasma deposition zone 114 in the chamber 100*b*. For example, the support carrier 104 can comprise an open frame 149 which mounts the battery supports 24 to expose both the first and second surfaces 26, 27 of each of the battery supports 24. The conveyer 146 moves the support carrier 104 across the chamber past the sputtering targets 62*a-d* during deposition to deposit an even thickness of sputtered material on the both sides 26,27 of the battery supports 24. For example, the support carrier 104 can be moved across the chamber 102*a* at a linear rate of at least about 5 cm/min or even from about 5 to about 100 cm/min.

For in-line systems, the support carrier 104 often continues to travel in the same direction, passing through multiple plasma zones 114 (not shown), and exiting from the other end of the chamber 100 through a load-lock chamber and then into a transfer area with a protective environment such as a non-reactive gas or vacuum.

A plurality of selected sputtering targets 62*a-d* are electrically coupled to adjacent magnetrons 78*a-d* in the chamber 100*b*, and a magnetron cooling system 122 is used to supply distilled or deionized water to the housings 80*a-d* of each of the magnetrons 78*a-d* to cool the magnets 82*a-c* and the targets 62*a-d* in each magnetron 78*a-d*. The sputtering targets 62*a-d* each comprise sputtering members 64*a-d* comprising rectangular plates composed of metal-containing material. However, sputtering members 64*a-d* comprising cylinders other shapes can also be used in the same arrangement and in the same chamber 100*b*. The sputtering targets 62*a-d* are electrically coupled via the electrically conducting magnetrons 78*a-d* to a plasma power source 118 that provides an AC (alternating current), RF or DC voltage to excite the process gas within the chamber 100*b*. The plasma power source 118 is electrically coupled to the sputtering targets 62*a-d*, or to pairs of adjacent sputtering targets 62*a,b* or 62*c,d*, as previously described. In one version, the plasma power source 118 provides an AC voltage as previously described. Further, in some versions useful for the deposition of dielectric materials such as LiPON, one or more impedance matching circuits 150 can be connected between the plasma power source 118 and sputtering targets 62*a-d*, to adjust the impedance of whichever sputtering target 62*a* through 62*d*, which has lower impedance relative to its partner paired target.

As before, one or more mesh screens 160*a,b* are positioned a set distance from the support carrier 104, and between the sputtering targets 62*a-d* or 62*e-h* and the first surfaces 26 or second surfaces 27 of the battery supports 24, as shown. The mesh screens 160*a,b* and support carrier 104 can be electrically isolated, floating or grounded relative to the chamber sidewall 108*a* and the sputtering targets 62, or electrically biased relative to the sidewall 108*a* or sputtering targets 62 by a mesh screen power source 121 which applies a negative (or positive) voltage relative to the plasma or relative to a time averaged voltage potential applied to the sputtering targets 62, as previously described.

Process gas which can contain non-reacting gases that serve to sputter material from the sputtering targets 62 and/or reactive gases that react with the sputtered material from the targets 62 is introduced into the chamber 100*b* by a gas supply 123 which can include compressed gas cylinders, flow meters, valves, and other flow control equipment. The process gas is introduced via the gas distributors 126*a-d* into the chamber 100*b*, each of which comprises gas holes 139*a-d* from which the process gas is passed. A gas exhaust 130 comprising a vacuum pump 133 can be used with a throttle valve 132 to control the pressure of the process gas within the chamber 100*b*. A heater 136 operated by a heater controller 138 maintains the battery supports 24 at an appropriate processing temperature. For example, the heater 136 can be a plurality of heater rods, such as at least 4 rods, or even from about 4 to about 12 rods, distributed across the chamber 100*b*.

The plasma chamber 100*b* can be controlled by a controller 119 that comprises program code to operate components of the chamber 100*b* to deposit battery component layers 30 on a plurality of battery supports 24 in the chamber 100*b*. In a sputtering process, the process gas mixture is controlled by first evacuating the chamber 100*b* and then introducing controlled amounts of process gas from the gas supply 123 via the gas distributor 126. The exhaust system 130 is used to maintain the process gas at a partial pressure. The magnetron cooling system 122 is then used to supply deionized water to the individual housings 80a-d of each of the magnetrons 78a-d to cool the magnets 82a-c therein. The sputtering process conditions are maintained for from about 2 to about 10 minutes, for example, about 6 minutes for the deposition of copper or even a few hours for the deposition of LiPON. After deposition is complete, the support carrier 104 is moved back to the transition mechanism 117, which is then vented, and the support carrier 104 thereafter removed. Again, for in-line system, the support carrier 104 can continue travel in the same direction, pass through multiple plasma zones 114 (not shown), and exit from the other end of the chamber through a load-lock chamber and into a protected area. The battery supports 24 can now be removed from the support carrier 104 and battery cells 22 formed on each of further processed as needed.

The fabrication process described herein can include processes of forming a battery cell 22 and batteries 20 which are found in, for example, commonly assigned U.S. patent application Ser. No. 12/032,997, entitled "LITHIUM BATTERY FABRICATION USING LASER SHAPING" to Nieh et al., filed on Feb. 18, 2008; and U.S. Pat. No. 6,921,464; U.S. Pat. No. 6,632,563, U.S. Pat. No. 6,863,699, and U.S. Pat. No. 7,186,479; all of which are incorporated by reference herein and in their entireties.

Exemplary Plasma Evaporation Apparatus

Figure 2C:
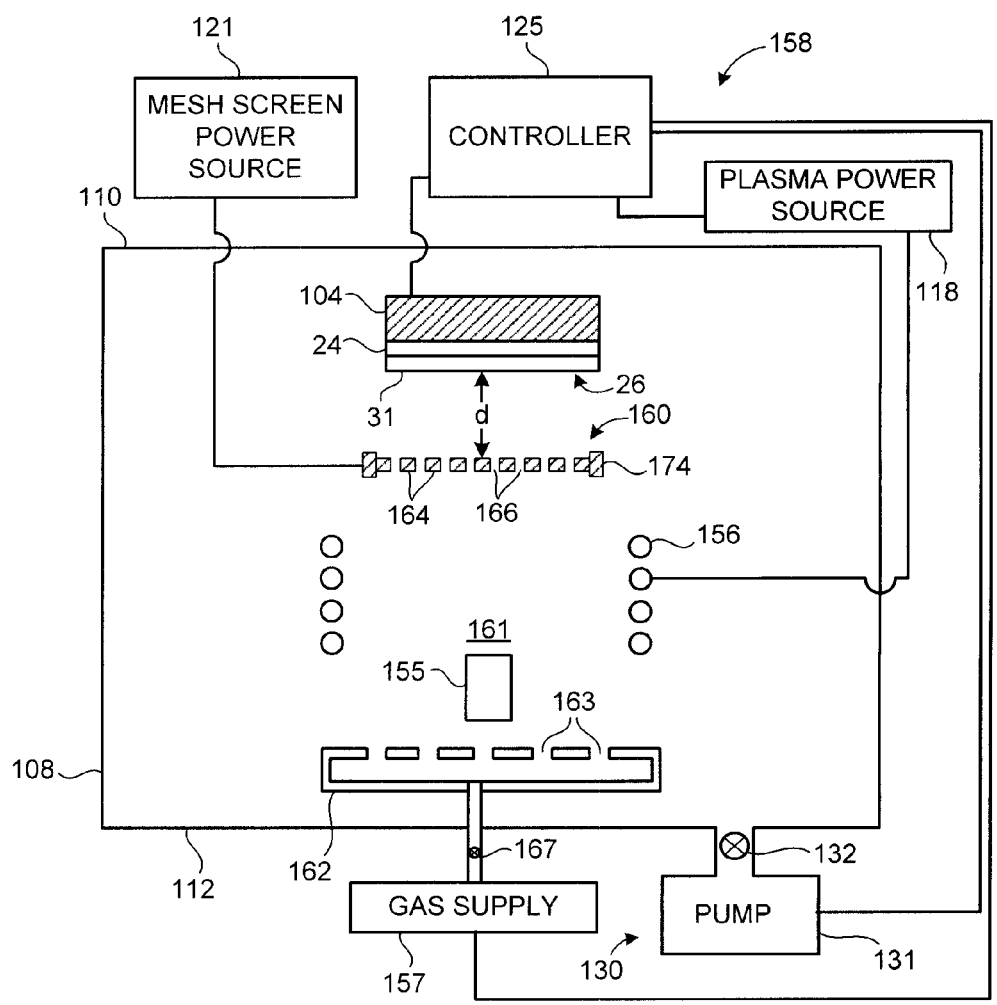
FIG. 2C is a sectional side schematic view of a plasma deposition apparatus comprising an evaporation chamber having a mesh screen between the exposed surface of the battery support and the process gas distributor.

An exemplary plasma evaporation apparatus comprising an evaporation chamber 158 is illustrated in FIG. 2C. The plasma evaporation apparatus can be used to deposit any of the metal-containing materials described herein, such as for example, the anode 48 comprising lithium. Generally, the evaporation chamber 158 comprises an enclosure having an evaporation source.

In the plasma evaporation process, a metal-containing source material is evaporated in the evaporation zone 161. In one version, the evaporation source comprises a crucible 155 which holds a metal-containing source material. The metal-containing source material is evaporated from the crucible 155 by heating the crucible. The metal-containing source material can be any of the metals described herein, such as lithium, aluminum, copper, etc. The crucible 155 is made of a material which is nonreactive with the evaporated to molten state of the metal-containing material. For example, in the evaporation of lithium, a piece of lithium is heated in a tantalum crucible. Typically, the lithium has to be heated to a temperature of at least about 500° C. to evaporate the lithium.

An inert gas environment can be provided around the crucible 155 to improve the microstructure of the deposited material. For example, an inert gas comprising argon can be maintained in the evaporation chamber at a pressure of from about 1 mTorr to about 10 mTorr. The inert gas can be provided through a gas manifold 162 located below the crucible 155. The gas manifold 162 comprises a number gas holes 163 for the passage of the inert gas. The gas supply 157 comprises an inert gas source. The flow rate of the inert gas can be controlled by a flow meter 167, such as a mass or volumetric flow meter.

In the evaporation process, the metal-containing source material can be heated by electrical energy, plasma energy or with laser energy. In the present version, the crucible 155 is heated by a direct current passing through the Ta crucible, which is provided by a crucible power supply (not shown), and can be controlled by the controller 119. A cylindrical coil 156 that located near the crucible creates a plasma by inductively coupling RF energy to the inert gas within the evaporation chamber. The inert gas forms an inductively-coupled plasma which provides energized Ar ions and ionizes part of the evaporated Li. Argon ions and Li ions are neutralized near the mesh and reach the substrate surface as neutral atoms with high energy (a few eV to 10s of eVs). These energized atoms improve the film quality deposited on the substrate. For example, the plasma power source 118 is controlled by the controller 125 to apply a current to the coil 156 to ignite and sustain a plasma within the boundaries of the coil. In one version, the plasma power source 118 applies a current of RF energy to the coil 156 at a power level of from about 100- to about 500 W, and at a frequency of about 13.56 MHz. Alternately, the cylindrical coil 156 can also be used to inductively heat the crucible 155 by inducing a current in the crucible.

In the plasma evaporation apparatus, a mesh screen 160 is located between the crucible 155 which is the source of the evaporated material and the battery support 24. The mesh screen 160 can be positioned a set distance d from the support carrier 104. A suitable distance d is from about 1 cm to about 20 cm, or even at least about 2 cm and less than about 10 cm. The mesh screen 160 and support carrier 104 can be electrically isolated, floating or grounded relative to the chamber sidewall 108a and the sputtering targets 62, or electrically biased relative to the sidewall 108 by a mesh screen power source 121 which applies a negative or positive voltage relative to the plasma formed in the evaporation zone. The mesh screen functions in the same manner as that described above to improve the quality of the material deposited onto the battery support 24.

In operation, the mesh screen 160 allows charge-neutral evaporated species to pass through its mesh openings 166 while neutralizing, impeding the passage of, or repelling and blocking, charged species of the evaporated. As a result a layer having a higher quality microstructure is deposited onto a battery support 24. The charged evaporated species are either neutralized when they strike, or repelled by, the floating, grounded, or DC biased mesh screen 160. For example, when the mesh screen 160 is maintained at a floating, ground or negative voltage potential, electrons are repelled by the solid grid 164 while positively charged evaporated species (such as the argon ions of the plasma in a plasma evaporative process) are attracted to the solid grid 164 to release electrons and become neutralized species. As a result, the sputtered species passing through the mesh screen 160 are primarily composed of neutral or charge neutralized plasma species.

The neutral evaporated species passed through the mesh openings 166 of the mesh screen 160 primarily deposit and accumulate on the exposed surface of the battery component layer 30 of the battery support 24. The neutral or neutralized species do not cause migration of charge-carrying metal ions, such as lithium ions from the underlying battery component layers 30. As a result these ions are not depleted from the underlying layers 30 and do not react with the process gases in the chamber 100 to form undesirable layers on the exposed surface of the battery support 24. In this manner both lithium ion depletion, and build up of undesirable surface compounds is prevented, resulting in better performing battery cells 22.

While particular examples of batteries, sputtering targets, process steps and process sequences, and chamber configurations are described herein to illustrate embodiments of the present process, it should be understood that other mesh screen configurations, sputtering target shapes, configurations of the plasma chamber 100, 100a, or 100b, and processes or sequences of process steps, can also be used as would be apparent to one of ordinary skill in the art. For example, the mesh screens 160 can have different shapes and structures depending on the shapes of the battery supports 24 or targets 62. for cylindrical targets 62, the mesh screens 160 can be shaped as a cylindrical mesh surrounding the target cylinder. Therefore, the spirit and scope of the appended claims should not be limited to the description of the preferred versions contained herein.

What is claimed is:

1. A plasma deposition method for depositing a battery component material on a partially fabricated battery cell in a plasma deposition zone, the method comprising:
    (a) providing in the plasma deposition zone, a battery support comprising at least one partially fabricated battery cell, the partially fabricated battery cell comprising a battery component layer containing charge-carrying metal species and having an exposed surface;
    (b) maintaining a mesh screen spaced apart, and at a preset distance from, the exposed surface of the battery component layer of the partially fabricated battery cell, the mesh screen having a plurality of mesh openings;
    (c) maintaining a pressure of a process gas in the plasma deposition zone; and
    (d) energizing the process gas to form a plasma by applying an electrical power to the process gas to deposit the battery component material onto the exposed surface of the battery component layer,
    whereby the mesh screen reduces migration of the charge-carrying metal species across the battery component layer.

2. A method according to claim 1 wherein (b) comprises electrically charging, grounding or floating, the mesh screen.

3. A method according to claim 1 wherein in (b) the mesh screen comprises mesh openings comprising at least one of the following:
    (i) a cumulative open area which is at least 70% of the total area of the mesh screen;
    (ii) an open area of at least 0.25 mm$^2$; and
    (iii) a dimension of at least 0.5 mm.

4. A method according to claim 1 wherein (b) comprises maintaining the mesh screen at at least one of:
    (i) a preset distance of at least 1 cm; and
    (ii) a preset distance of less than 10 cm.

5. A method according to claim 1 wherein in (a), the partially fabricated battery cell comprises a battery component layer that is at least one of:
    (i) a cathode or electrolyte; and
    (ii) a lithium-containing material.

6. A method according to claim 5 wherein the lithium-containing material comprises lithium cobalt oxide or LiPON.

7. A method according to claim 6 wherein the battery component material being deposited comprises LiPON or copper.

8. A plasma deposition method comprising:
    (a) providing a battery support on a support carrier in a plasma deposition zone, the battery support comprising at least one partially fabricated battery cell having a battery component layer with an exposed surface, the battery component layer containing charge-carrying metal species;
    (b) maintaining in the plasma deposition zone, a mesh screen at a preset distance away from the support carrier such that the exposed surface of the battery component layer of the partially fabricated battery cell is spaced apart from the mesh screen, the mesh screen having a plurality of mesh openings;
    (c) maintaining a pressure of a process gas in the plasma deposition zone; and
    (d) energizing the process gas to form a plasma by applying an electrical power to the process gas to deposit the battery component material onto the exposed surface of the battery component layer,
    whereby the mesh screen reduces migration of the charge-carrying metal species across the battery component layer.

9. A method according to claim 8 wherein (b) comprises electrically charging, grounding or floating, the mesh screen.

10. A method according to claim 8 wherein in (b) the mesh screen comprises mesh openings comprising at least one of the following:
    (i) a cumulative open area which is at least 70% of the total area of the mesh screen;
    (ii) an open area of at least 0.25 mm$^2$; and
    (iii) a dimension of at least 0.5 mm.

11. A method according to claim 8 wherein (b) comprises maintaining the mesh screen at at least one of:
    (i) a preset distance of at least 1 cm; and
    (ii) a preset distance of less than 10 cm.

12. A method according to claim 8 wherein in (a), the partially fabricated battery cell comprises a battery component layer comprising a lithium-containing material.

13. A method according to claim 12 wherein the battery component material being deposited comprises LiPON or copper.

14. A plasma deposition method comprising:
    (a) providing a battery support on a support carrier in a plasma deposition zone, the battery support comprising at least one partially fabricated battery cell having a battery component layer with an exposed surface, the battery component layer containing charge-carrying metal species;
    (b) maintaining in the plasma deposition zone, a mesh screen at a distance of at least 1 cm away from the support carrier such that the exposed surface of the battery component layer of the partially fabricated battery cell is spaced apart from the mesh screen, the mesh screen having a plurality of mesh openings;
    (c) maintaining a pressure of a process gas in the plasma deposition zone; and
    (d) energizing the process gas to form a plasma by applying an electrical power to the process gas to deposit the battery component material onto the exposed surface of the battery component layer,
    whereby the mesh screen reduces migration of the charge-carrying metal species across the battery component layer.

15. A method according to claim 14 wherein in (a), the partially fabricated battery cell comprises a battery component layer comprising a lithium-containing material.

16. A method according to claim 15 wherein the battery component material being deposited comprises LiPON or copper.

17. A method according to claim 14 wherein in (b), the mesh screen is attached to the support carrier or to a chamber wall.

* * * * *